US012152302B2

(12) United States Patent
Daito et al.

(10) Patent No.: US 12,152,302 B2
(45) Date of Patent: Nov. 26, 2024

(54) MULTIPLE-CHANNEL SHOWERHEAD DESIGN AND METHODS IN MANUFACTURING

(71) Applicant: Applied Materials, Inc., Santa Clara, CA (US)

(72) Inventors: Kazuya Daito, Milpitas, CA (US); Jallepally Ravi, San Ramon, CA (US); Harpreet Singh, Santa Clara, CA (US)

(73) Assignee: APPLIED MATERIALS, INC., Santa Clara, CA (US)

( * ) Notice: Subject to any disclaimer, the term of this patent is extended or adjusted under 35 U.S.C. 154(b) by 404 days.

(21) Appl. No.: 16/923,403

(22) Filed: Jul. 8, 2020

(65) Prior Publication Data

US 2022/0010431 A1 Jan. 13, 2022

(51) Int. Cl.
C23C 16/455 (2006.01)

(52) U.S. Cl.
CPC .. *C23C 16/45565* (2013.01); *C23C 16/45574* (2013.01)

(58) Field of Classification Search
CPC .................. C23C 16/45574; C23C 16/45565
See application file for complete search history.

(56) References Cited

U.S. PATENT DOCUMENTS

| 6,050,506 A | 4/2000 | Guo et al. |
| 6,086,677 A | 7/2000 | Umotoy et al. |
| 6,090,210 A | 7/2000 | Ballance et al. |
| 6,148,761 A | 11/2000 | Majewski et al. |
| 6,454,860 B2 | 9/2002 | Metzner et al. |
| 6,481,886 B1 | 11/2002 | Narendrnath et al. |
| 7,942,969 B2 | 5/2011 | Riker et al. |
| 8,894,767 B2 | 11/2014 | Chuc et al. |
| 8,955,547 B2 | 2/2015 | Gungor et al. |
| 8,960,235 B2 | 2/2015 | Carlson |
| 9,057,128 B2 | 6/2015 | Olgado |
| 9,109,754 B2 | 8/2015 | Yudovsky et al. |

(Continued)

FOREIGN PATENT DOCUMENTS

| CN | 2848367 Y | 12/2006 |
| CN | 103098175 A | 5/2013 |

(Continued)

OTHER PUBLICATIONS

International Search Report and Written Opinon dated Jul. 19, 2021 for Application No. PCT/US2021/026968.

(Continued)

*Primary Examiner* — Dah-Wei D. Yuan
*Assistant Examiner* — Nga Leung V Law
(74) *Attorney, Agent, or Firm* — Patterson + Sheridan, LLP

(57) ABSTRACT

A method and apparatus for producing a gas distribution apparatus are described herein. More specifically, a method and apparatus for producing triple-channel gas distribution apparatus is described herein. The gas distribution apparatus described herein includes an upper plate, a middle plate, and a lower plate. The middle plate and the lower plate are machined before all of the upper plate, the middle plate, and the lower plate are bonded. Additional machining is then performed on the gas distribution apparatus. The gas distribution apparatus is used to distribute three or more process gases into a processing chamber.

12 Claims, 13 Drawing Sheets

(56) References Cited

U.S. PATENT DOCUMENTS

| | | |
|---|---|---|
| 9,132,436 B2 | 9/2015 | Liang et al. |
| 9,396,909 B2 | 7/2016 | Carlson |
| 9,644,267 B2 | 5/2017 | Burrows et al. |
| 2004/0216668 A1 | 11/2004 | Lindfors et al. |
| 2006/0021703 A1* | 2/2006 | Umotoy ............ C23C 16/45565 156/345.33 |
| 2009/0022205 A1 | 1/2009 | Comendant |
| 2009/0095221 A1 | 4/2009 | Tam et al. |
| 2009/0095222 A1 | 4/2009 | Tam et al. |
| 2009/0211707 A1 | 8/2009 | Chao et al. |
| 2012/0024478 A1 | 2/2012 | Huang et al. |
| 2012/0064698 A1* | 3/2012 | Olgado ............ C23C 16/45576 118/715 |
| 2012/0234945 A1* | 9/2012 | Olgado ............ C23C 16/45572 239/589 |
| 2013/0087093 A1 | 4/2013 | Olgado et al. |
| 2013/0118405 A1 | 5/2013 | Ho et al. |
| 2014/0235069 A1 | 8/2014 | Breiling et al. |
| 2018/0323093 A1 | 11/2018 | Zhang et al. |
| 2019/0078205 A1 | 3/2019 | Jallepally et al. |

FOREIGN PATENT DOCUMENTS

| | | |
|---|---|---|
| CN | 103168343 A | 6/2013 |
| CN | 103443903 A | 12/2013 |
| CN | 107799379 A | 3/2018 |
| JP | 2015-225856 A | 12/2015 |
| KR | 1906355 | 10/2018 |
| TW | 459268 | 10/2001 |
| TW | 201920753 A | 6/2019 |
| WO | 2012024033 A2 | 2/2012 |
| WO | 2012036856 A2 | 3/2012 |
| WO | 2012-128789 A1 | 9/2012 |

OTHER PUBLICATIONS

Chinese Office Action dated Jan. 17, 2024 re: Chinese Patent Application No. 202180030947.5.
International Search Report dated Jan. 3, 2024 for PCT/US2023/032862.
Taiwan Office Action dated Aug. 2, 2024 for Application No. 110114075.
Chinese Office Action dated Aug. 16, 2024 for Application No. 202180030947.5.

* cited by examiner

MULTIPLE-CHANNEL SHOWERHEAD DESIGN AND METHODS IN MANUFACTURING

BACKGROUND

Field

Embodiments of the present disclosure generally relate to methods for semiconductor processing. Specifically, embodiments of the present disclosure relate to methods of forming a multiple-channel gas distributor apparatus and gas distributor apparatus designs enabled by the method disclosed herein.

Description of the Related Art

In the field of semiconductor processing, flat-panel display processing, or other electronic device processing, vapor deposition processes have played an important role in depositing materials on substrates. As the geometries of electronic devices continue to shrink and the density of devices continues to increase, the size and aspect ratio of the features are becoming more aggressive, e.g., feature sizes of 0.07 µm and aspect ratios of 10 or greater. Accordingly, conformal deposition of materials to form these devices is becoming increasingly important.

In some methods of electronic device manufacturing, it is beneficial to use multiple separate, but subsequent, deposition processes with multiple reactant gases utilized simultaneously. In some applications, it is desirable to expose a substrate to three or more reactant gases simultaneously or in close succession. To adequately distribute multiple gases simultaneously over a substrate, gas distribution apparatus are utilized.

Gas distribution apparatus, sometimes shaped like and referred to as showerheads, distribute processing gases to a substrate (also referred to as a wafer) at close proximity. Gas distribution apparatuses, including showerheads, have large volumes which can be very difficult to clean or purge between gases. Any gases remaining in the showerhead may react with subsequent processing gases. Separation of gases is important within a gas distribution apparatus, including showerheads, that relies on alternating pulses of gases, for example, an A pulse, a B pulse, a C pulse, an A pulse, a C pulse, and a B pulse type delivery. Therefore, there is an ongoing need in the art for improved gas distribution apparatuses, including showerheads, that are easy to clean/purge and provide a uniform supply of gases to the substrate.

SUMMARY

The present disclosure generally relates to a method of manufacturing a gas distribution apparatus. The method includes forming a lower plate by a process including forming a plurality of first passages through a body portion of the lower plate, and forming a plurality of second passages through the body portion of the lower plate, wherein the lower plate has a top surface and a bottom surface that is opposite to the top surface, and the plurality of first passages and the plurality of second passages both extend from the top surface to the bottom surface. The method further includes forming a middle plate by a process including forming one or more first lower channels on a bottom surface of a body portion of the middle plate, wherein the bottom surface is opposite to a top surface of the middle plate, forming one or more second lower channels on the bottom surface of the body portion of the middle plate, forming a first upper channel on the top surface of the body portion of the middle plate, forming a second upper channel on the top surface of the body portion of the middle plate, forming a plurality of first connection passages between the first lower channels and the first upper channel, and forming a plurality of second connection passages between the second lower channels and the second upper channel. The top surface of the lower plate is bonded to the bottom surface of the middle plate and the top surface of the middle plate is bonded to a bottom surface of an upper plate to form a coupled gas distribution apparatus, wherein the bottom surface of the upper plate is opposite to a top surface of the upper plate. A plurality of main passages are formed through the coupled gas distribution apparatus, wherein the plurality of main passages extend from a top surface of the upper plate to the bottom surface of the lower plate.

The present disclosure further relates to a gas distribution apparatus. The gas distribution apparatus includes a lower plate, the lower plate further including a plurality of first passages and a plurality of second passages. The gas distribution apparatus also includes a middle plate bonded to the lower plate, the middle plate further including a top surface, a bottom surface, one or more first lower channels disposed within the bottom surface, one or more second lower channels disposed within the bottom surface, a first upper channel disposed within the top surface, a second upper channel disposed within the top surface, a plurality of first connection passages between the first lower channels and the first upper channel, and a plurality of second connection passages between the second lower channels and the second upper channel. An upper plate is bonded to the middle plate. A plurality of main passages are disposed through each of the lower plate, the middle plate, and the upper plate.

The present disclosure includes another method of manufacturing a gas distribution apparatus. The method includes forming a plurality of main passages through a coupled gas distribution apparatus, wherein the coupled gas distribution apparatus comprises a lower plate that is bonded to a bottom surface of a middle plate and an upper plate that is bonded to a top surface of the middle plate, and the plurality of main passages extend through the upper plate, the middle plate and the lower plate. The upper plate includes a plurality of first passages extending through a body portion of the lower plate, and a plurality of second passages extending through the body portion of the lower plate. The middle plate includes one or more first lower channels that are formed on the bottom surface of the middle plate, one or more second lower channels that are formed on the bottom surface of the middle plate, a first upper channel on the top surface of the middle plate, a second upper channel on the top surface of the middle plate, a plurality of first connection passages between the first lower channels and the first upper channel, and a plurality of second connection passages between the second lower channels and the second upper channel.

BRIEF DESCRIPTION OF THE DRAWINGS

So that the manner in which the above recited features of the present disclosure can be understood in detail, a more particular description of the disclosure, briefly summarized above, may be had by reference to embodiments, some of which are illustrated in the appended drawings. It is to be noted, however, that the appended drawings illustrate only exemplary embodiments and are therefore not to be considered limiting of its scope, may admit to other equally effective embodiments.

To facilitate understanding, identical reference numerals have been used, where possible, to designate identical elements that are common to the figures. It is contemplated that elements and features of one embodiment may be beneficially incorporated in other embodiments without further recitation.

DETAILED DESCRIPTION

The present disclosure generally relates to methods for semiconductor processing. Specifically, embodiments of the present disclosure relate to methods of forming a multiple-channel gas distributor apparatus and gas distributor apparatus designs enabled by the method disclosed herein. The gas distribution apparatus described may be referred to as a showerhead or gas distribution plate, but it will be recognized by those skilled in the art that the apparatus does not need to be shaped like a showerhead or plate. The term "showerhead" and "plate" should not be taken as limiting the scope of the inventor.

Figure 1:
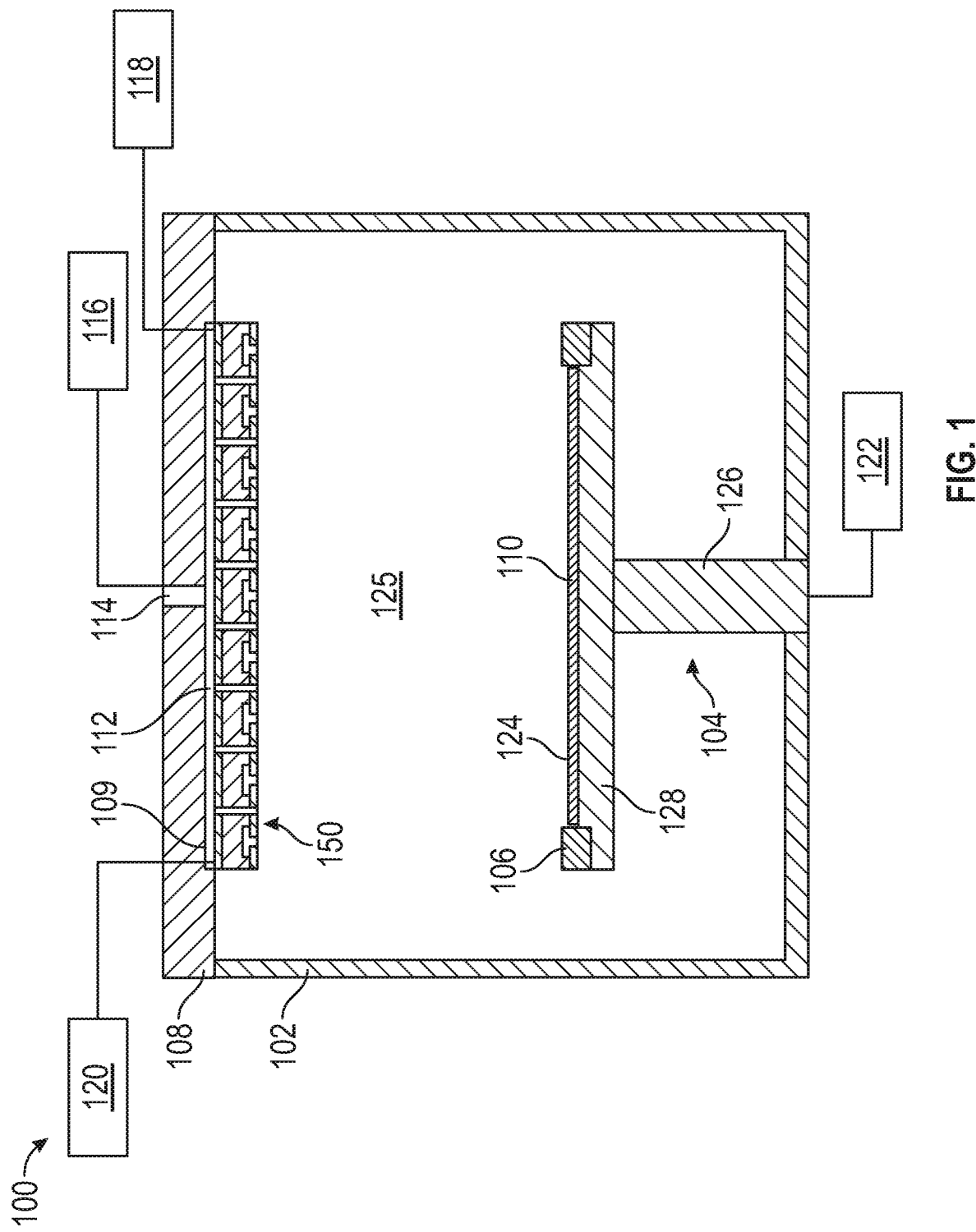
FIG. 1 illustrates a schematic view of an exemplary substrate processing chamber.

FIG. 1 illustrates a schematic view of a substrate processing chamber 100. The processing chamber 100 includes a chamber body 102, a chamber lid 108, a support assembly 104, and a gas distribution apparatus 150. The chamber body 102, the chamber lid 108, the support assembly 104, and the gas distribution apparatus 150 enclose and define a processing volume 125.

The chamber body 102 is the outer portion of the processing chamber 100 and includes the sidewalls and the bottom of the process chamber 100. The support assembly 104 is disposed within the chamber body 102. The support assembly 104 includes a support portion 128 and a shaft 126. The shaft 126 is a vertical member at least partially disposed within the processing volume 125. A portion of the shaft 126 may be disposed outside of the processing volume 125 and the chamber body 102. The support portion 128 is disposed on top of the shaft 126. The support portion 128 includes a substrate receiving surface 124 and an edge ring 106 disposed adjacent to the substrate receiving surface 124. The substrate receiving surface 124 is the top surface of the support portion 128. The bottom surface of the support portion 128 is coupled to the shaft 126. A controller 122 is connected to the support assembly 104 and controls the motion of the support assembly 104. In some embodiments, the support assembly 104 is motorized. The support assembly 104 moves vertically upwards and downwards and rotates about a vertical axis disposed through the center of the shaft 126. The controller 122 provides power and controls the support assembly 104 to enable motion.

The lid 108 is disposed on top of the chamber body 102 and includes the gas distribution apparatus 150, a plenum 112, and a gas inlet 114 disposed therein. The lid 108 supports the gas distribution apparatus 150 and may surround at least a portion of the outer surface of the gas distribution apparatus 150. The gas inlet 114 is disposed through the top of the lid 108 and transports a first process gas from a first process gas source 116 to the plenum 112. The plenum is disposed between the gas distribution apparatus 150 and a surface 109 of the lid 108. The plenum 112 is an open space formed above the gas distribution apparatus 150 in which a first process gas accumulates and distributes over the top surface of the gas distribution apparatus 150. The first process gas is then distributed into the processing volume 125 through the gas distribution apparatus 150 via a first set of apertures.

The showerhead further includes a second set of apertures and a third set of apertures. The second set of apertures distributes a second process gas to the processing volume 125 from the second process gas source 118. The third set of apertures distributes a third process gas to the processing volume 125 from the third process gas source 120. Each of the process gases from the first process gas source 116, the second process gas source 118, and the third process gas source 120 may include different process gases. The three different process gases may be distributed into the processing volume 125 and deposited onto a substrate, such as the substrate 110. The process gases may be dispersed simultaneously or sequentially depending upon the process utilized within the processing chamber 100.

Figure 2:
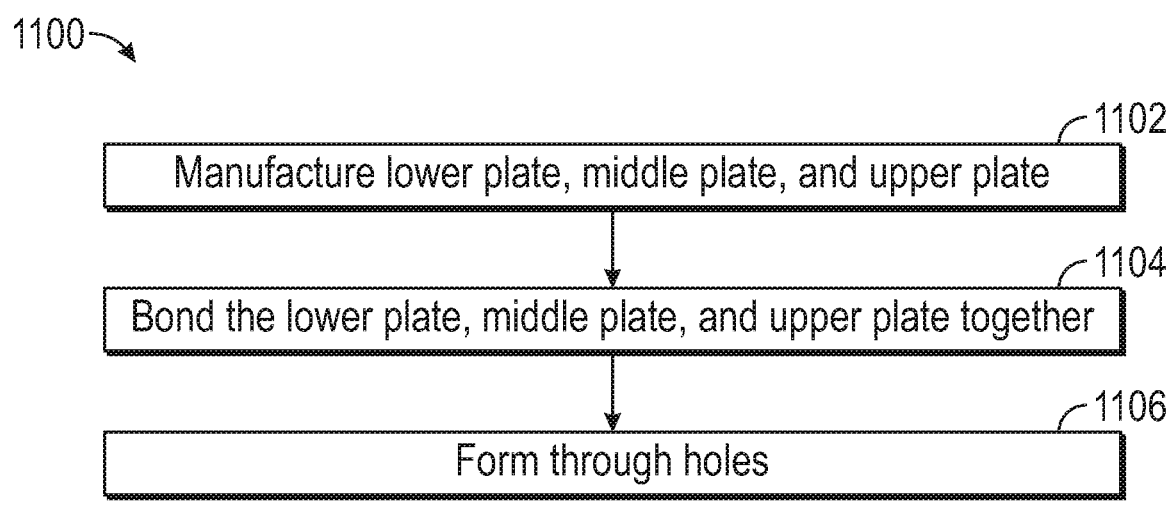
FIG. 2 illustrates a method of manufacturing the gas distributor apparatus.
Figure 3:
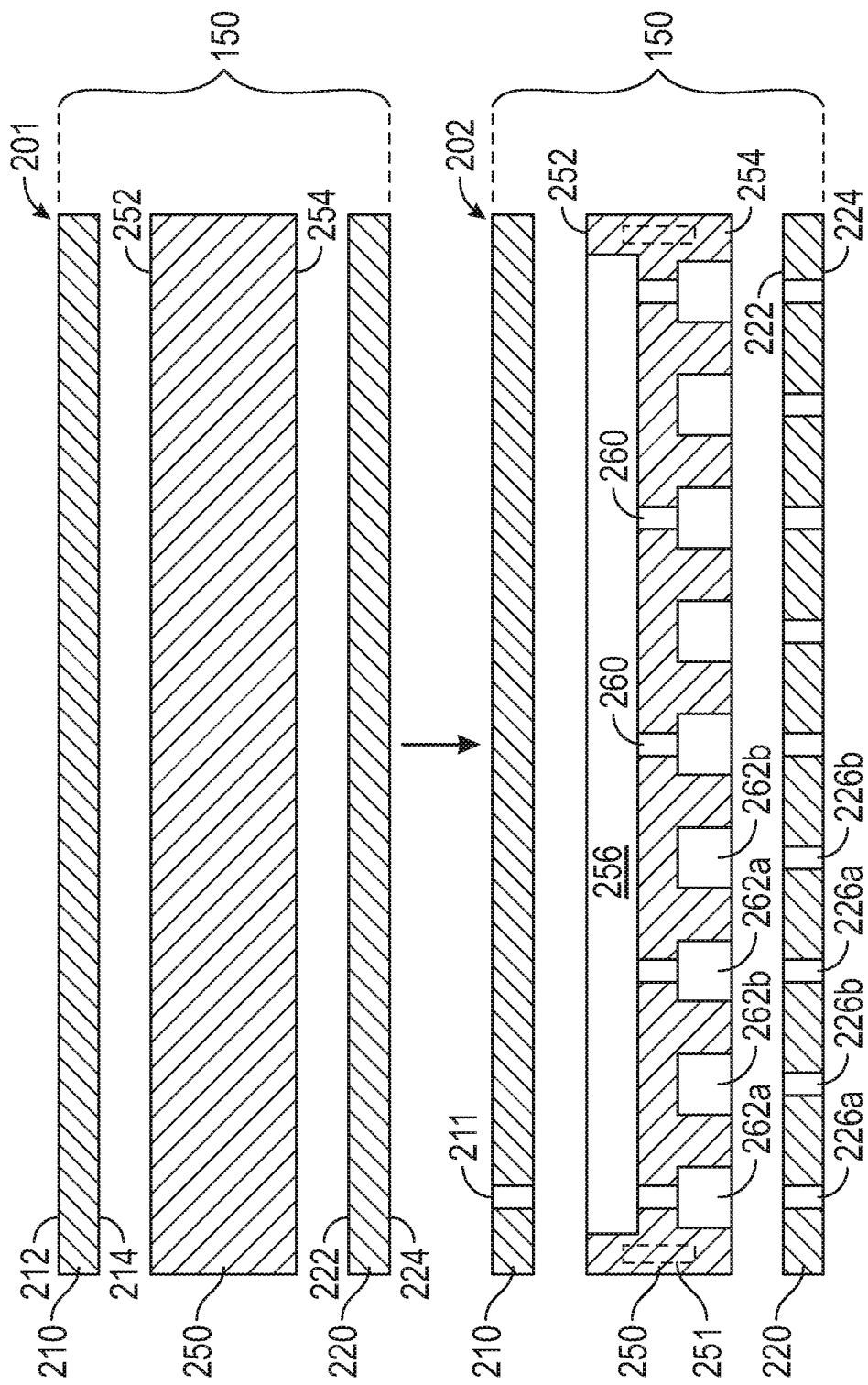
FIG. 3 illustrates partial cross-sectional views of a gas distributor apparatus before and after a first manufacturing operation.
Figure 4A:
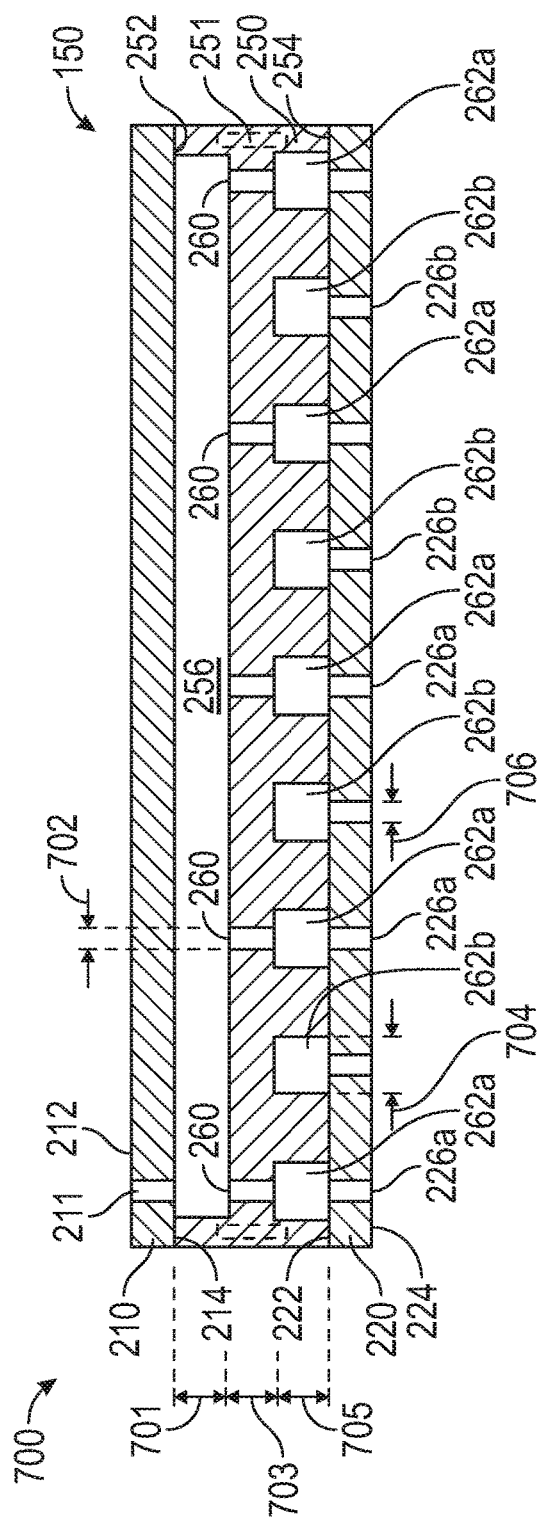
FIG. 4A illustrates a partial cross-sectional view of a gas distributor apparatus after a second manufacturing operation.
Figure 4B:
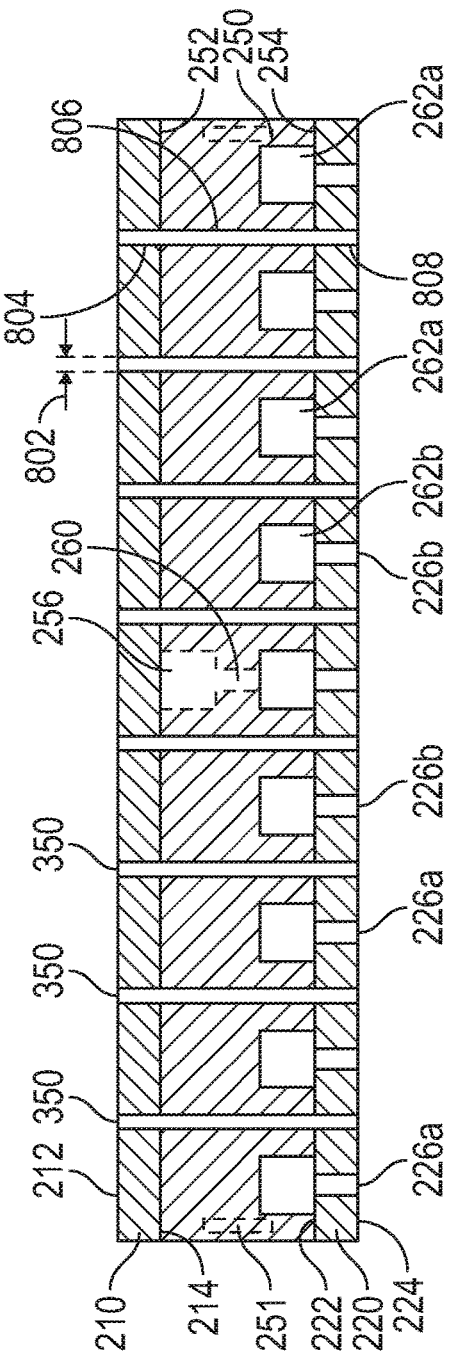
FIG. 4B illustrates a partial cross-sectional view of a gas distributor apparatus through a first plane after a third manufacturing operation.

FIG. 2 illustrates a method 1100 of manufacturing the gas distributor apparatus 150. The method 1100 includes a first manufacturing operation 1102 of manufacturing a lower plate 220, a middle plate 250, and an upper plate 210 (FIG. 3). A second manufacturing operation 1104 of bonding the lower plate 220, the middle plate 250, and the upper plate 210 together is performed after the first manufacturing operation 1102 (FIG. 4A). A third manufacturing operation 1106 of forming a plurality of main passages 350 is performed after the second manufacturing operation 1104 (FIG. 4B). FIG. 3 illustrates partial exploded cross-sectional views of a gas distributor apparatus 150 before and after a first manufacturing operation 1102. The gas distributor apparatus 150 includes an upper plate 210, a middle plate 250, and a lower plate 220. The upper plate 210 includes a top surface 212 and a bottom surface 214. The middle plate 250 includes a top surface 252 and a bottom surface 254. The lower plate 220 includes a top surface 222 and a bottom surface 224.

The first manufacturing operation 1102 is used to manufacture the lower plate 220, the middle plate 250, and the upper plate 210 portions of the gas distribution apparatus 150, and generally includes the formation of various channels and passages in the lower plate 220, the middle plate 250, and the upper plate 210, which are illustrated and described in relation to FIGS. 3-10 below. In one embodiment, a first upper channel 256, a second upper channel 258, a plurality of first connection passages 260, a plurality of second connection passages 261, one or more first lower channels 262a, and one or more second lower channels 262b are formed in middle plate 250. Additionally, a plurality of first passages 226a and a plurality of second passages 226b are formed in the lower plate 220. The first manufacturing operation 1102 is performed after the initial formation of the lower plate 220, the middle plate 250, and the upper plate 210 has been completed, which is illustrate by the upper portion of FIG. 3 and illustrates the components used to form the gas distribution apparatus 150.

At the initial stage, which is part of the first manufacturing operation 1102 used to form the complete gas distributor apparatus 150, utilizes pre-fabricated plates as the upper plate 210, the middle plate 250, and the lower plate 220. The pre-fabricated plates form the body, or body portions, of the upper plate 210, the middle plate 250, and the lower plate 220. The upper plate 210, the middle plate 250, and the lower plate 220 are planar, such that the top surfaces 212, 252, 222 are planar and the bottom surfaces 214, 254, and 224 are planar. The upper plate 210, the middle plate 250, and the lower plate 220 have a diameter substantially greater than the thickness of each of the upper plate 210, the middle plate 250, and the lower plate 220. The diameter of each of the upper plate 210, the middle plate 250, and the lower plate 220 is about 250 mm to about 550 mm, such as about 300 mm to about 450 mm, such as about 300 mm to about 425 mm. In some embodiments, the upper plate 210, the middle plate 250, and the lower plate 220 only have channels and passages formed through a central portion of each of the upper plate 210, the middle plate 250, and the lower plate 220. In some embodiments, the overall diameter of each of the upper plate 210, the middle plate 250, and the lower plate 220 is in a range of about 350 mm to about 500 mm, such as about 350 mm to about 450 mm, while the outer diameter of the central portion of each of the upper plate 210, the middle plate 250, and the lower plate 220 is less than about 325 mm in diameter, such as about 280 mm to about 310 mm. The central portion of each of the upper plate 210, the middle plate 250, and the lower plate 220 is defined as the region which includes channels or passages formed there through. The thickness of the upper plate 210 is about 1 mm to about 15 mm, such as about 1 mm to about 10 mm, such as about 5 to about 10 mm, such as about 50 mm. In some embodiments the upper plate 210 has a thickness of less than about 15 mm, such as less than 12 mm, such as less than 10 mm. The thickness of the middle plate 250 is about 8 mm to about 30 mm, such as about 10 mm to about 25 mm, such as about 10 mm to about 20 mm, such as about 10 mm. In some embodiments the middle plate 250 has a thickness of less than about 20 mm, such as less than 15 mm, such as less than 10 mm. The thickness of the lower plate 220 is about 1 mm to about 15 mm, such as about 5 mm to about 10 mm, such as about 5 mm. In some embodiments the lower plate 220 has a thickness of less than about 15 mm, such as less than 12 mm, such as less than 10 mm.

While the upper plate 210, the middle plate 250, and the lower plate 220 are in the initial apparatus stage 201, the upper plate 210, the middle plate 250 and the lower plate 220 are solid plates. The upper plate 210, the middle plate 250, and the lower plate 220 may each be made of a metal, dielectric, or a ceramic material. The metal, dielectric, or ceramic materials which make up the upper plate 210, the middle plate 250, and the lower plate 220 include aluminum, anodized aluminum, stainless steel, nickel, aluminum oxide, aluminum nitride, silicon, yttria oxide, or yttria stabilized zirconia. In some embodiments, the upper plate 210, the middle plate 250, and the lower plate 220 are a 6000 series aluminum, such as 6061 aluminum or 6063 aluminum. In some embodiments, the material of each of the upper plate 210, the middle plate 250, and the lower plate 220 is the same. In yet other embodiments, the material of each of the upper plate 210, the middle plate 250, and the lower plate 220 is different, such that the middle plate is made from a different material from either of the upper plate 210 or the lower plate 220. During the initial apparatus stage 201, each of the upper plate 210, the middle plate 250, and the lower plate 220 are separated and have not been coupled together. This allows each of the upper plate 210, the middle plate 250, and the lower plate 220 to undergo processing operations individually and provides greater flexibility.

Referring to FIGS. 3 and 4A-4B, during the first manufacturing operation 1102 the lower plate 220 is manufactured by the formation of the first passages 226a and the second passages 226b through the body of the lower plate 220. The first passages 226a and the second passages 226b may be formed by machining the initially formed lower plate 220. Machining the lower plate 220 includes drilling the first passages 226a and the second passages 226b through the lower plate 220.

The plurality of first passages 226a and the plurality of second passages 226b are formed vertically through the body of the lower plate 220, such that the plurality of first passages 226a and the plurality of second passages 226b are parallel to each other. The plurality of the first passages 226a and the plurality of second passages 226b extend from the top surface 222 to the bottom surface 224 of the lower plate 220. The first passages 226a are disposed throughout the lower plate 220. The second passages 226b are disposed between the first passages 226a, such that the first passages 226a and the second passages 226b are formed, for example, in an alternating pattern as the lower plate 220 extends radially outwards. The first passages 226a and the second passages 226b are evenly spaced from one another. The first passages 226a are aligned with the first lower channels 262a and the second passages 226b are aligned with the second lower channels 262b.

During the first manufacturing operation 1102 the middle plate 250 is manufactured by the formation of the first upper channel 256, the second upper channel 258, the first connection passages 260, the second connection passages 261, the first lower channels 262a, and the second lower channels 262b. The first upper channel 256, the second upper channel 258, the first lower channels 262a, and the second lower channels 262b are formed by groove or slot milling.

The top surface 252 of the middle plate 250 is machined to form the first upper channel 256 and the second upper channel 258. Various different configurations of the first upper channel 256 and the second upper channel 258 are illustrated in FIGS. 3-8B, and are described in detail below. The first upper channel 256 and the second upper channel 258 may be any one of the first upper channels 256 or the second upper channels 258 described herein. The first upper channel 256 and the second upper channel 258 are formed independently of one another and are formed on separate parts of the top surface 252, such that the first upper channel 256 and the second upper channel 258 do not overlap or intersect. The first upper channel 256 and the second upper channel 258 have a first gas input 211 and a second gas input 213 connected thereto, such that the first upper channel 256 is fluidly connected to the second process gas source 118 via the first gas input 211 and the second upper channel 258 is fluidly connected to the third process gas source 120 via the second gas input 213.

The bottom surface 254 of the middle plate 250 is machined to form the first lower channels 262a and the second lower channels 262b. The first lower channels 262a and the second lower channels 262b may be any one of the first lower channels 262a or the second lower channels 262b described herein. The second lower channels 262b are disposed between each of the first lower channels 262a, such that the first lower channels 262a and the second lower channels 262b are disposed in a desired pattern, such as an alternating pattern.

During the first manufacturing operation 1102 the first connection passages 260 are formed after the formation of the first upper channel 256 and the first lower channels 262a. The first connection passages 260 are machined between the first upper channel 256 and the first lower channels 262a by use of a machining process, such as a drilling process. The second connection passages 261 are formed after the formation of the second upper channel 258 and the second lower channels 262b. The second connection passages 261 are machined between the second upper channel 258 and the second lower channels 262b by drilling.

The plurality of first connection passages 260 fluidly connect the first lower channels 262a and the first upper channel 256. The first connection passages 260 are vertical passages, which connect a bottom surface of the first upper channel 256 to the top surface of the first lower channels 262a. In some embodiments, the first connection passages 260 are cylindrical passages formed through the body of the middle plate 250. The first connection passages 260 have a diameter of less than about 6 mm, such as less than about 5 mm, such that the diameter of the first connection passages 260 is about 1 mm to about 5 mm, such as about 2 mm to about 4 mm. In some embodiments, the first connection passages 260 are not cylindrical and are instead a slot shaped, oval shaped, or rectangular prisms, pentagonal prisms, hexagonal prisms, octagonal prisms, or any suitable prism shape. In some embodiments, the diameter of the first connection passages 260 may vary as the first connection passages 260 extend through the middle plate 250, such that the diameter of the first connection passage 260 adjacent to the first lower channels 262a is different from the diameter of the first connection passage 260 at the first upper channel 256.

The plurality of second connection passages 261 fluidly connect the second lower channels 262b and the second upper channel 258. The second connection passages 261 are vertical passages, which connect a bottom surface of the second upper channel 258 to the top surface of the second lower channels 262b. In some embodiments, the second connection passages 261 are cylindrical passages formed through the body of the middle plate 250. In some embodiments, the second connection passages 261 are not cylindrical and are instead slot shaped, oval shaped, or rectangular prisms, pentagonal prisms, hexagonal prisms, octogonal prisms, or any suitable prism shape. In some embodiments, the diameter of the first connection passages 260 may vary as the second connection passages 261 extend through the middle plate 250, such that the diameter of the second connection passage 261 adjacent to the second lower channels 262b is different from the diameter of the second connection passage 261 at the second upper channel 258.

The first connection passages 260 and the second connection passages 261 are typically parallel to one another. In some embodiments, the first connection passages 260 and the second connection passages 261 are disposed in an alternating pattern (not shown).

In some embodiments, a cooling channel 251 is disposed through the middle plate 250 of the gas distributor apparatus 150. The cooling channel 251 may wrap around the outer diameter of the middle plate 250 and circulate a cooling fluid, such as water there through. In some alternative embodiments, the cooling channel 251 is instead a heating component, such as a heating wire and is used to heat the middle plate 250 of the gas distributor apparatus 150. In yet other embodiments, both a cooling channel and a heating component are disposed in the middle plate 250 of the gas distributor apparatus 150.

During the first manufacturing operation 1102, the first gas input 211 and the second gas input 213 (shown in FIG. 9) are formed through the upper plate 210. The first gas input 211 fluidly connects the second process gas source 118 to the first upper channel 256. The second gas input 213 fluidly connects the third process gas source 120 to the second upper channel 258. The first gas input 211 and the second gas input 213 are disposed vertically through the upper plate 210. The first gas input 211 and the second gas input 213 are cylindrical apertures formed through the upper plate 210.

The first gas input 211 and the second gas input 213 are formed along an outer portion of the upper plate 210, such that the first gas input 211 is disposed in the same position as a portion of the arcs 312 or the outer semicircular passage 314, such that the first gas input 211 intersects one of the arcs 312 or the outer semicircular passage 314. The second gas input 213 is disposed in the same position as a portion of the first cross stroke 302 or the second cross stroke 304, such that the second gas input 213 intersects one of the first cross stroke 302 or the second cross stroke 304. The first gas input 211 and the second gas input 213 are fluidly isolated from any of the main passages 350 formed through the upper plate 210 during subsequent operations.

The upper plate 210, the middle plate 250, and the lower plate 220 are also deburred and cleaned subsequent to machining the first upper channel 256, the second upper channel 258, the first connection passages 260, the second connection passages 261, the first lower channels 262a, the second lower channels 262b, the first passages 226a, and the second passages 226b. Deburring the upper plate 210, the middle plate 250, and the lower plate 220 includes manually removing the burrs using a simple mechanical process or using electromechanical deburring. The cleaning of the upper plate 210, the middle plate 250, and the lower plate 220 includes soaking the plates in a chemical solution, rinsing the plates, polishing the plates, or a combination thereof. Cleaning of the upper plate 210, the middle plate 250, and the lower plate 220 improves the wettability or brazeability of the plates during the second manufacturing operation 1104, and also will allow the parts to be used in a vacuum environment after the gas distribution apparatus 150 is completely formed.

Next, the second manufacturing operation 1104 (FIG. 4A) is performed subsequent to the completion of the first manufacturing operation 1102. The second manufacturing operation 1104 includes positioning, aligning and bonding the top surface 222 of the lower plate 220 to the bottom surface 254 of the middle plate 250 and bonding the bottom surface 214 of the upper plate 210 to the top surface 252 of the middle plate 250.

During the second manufacturing operation 1104, the upper plate 210, the middle plate 250, and the lower plate 220 are positioned adjacent to one another, such that the upper plate 210 is disposed above the middle plate 250 and the bottom surface 214 of the upper plate 210 is disposed on the top surface 252 of the middle plate 250. The lower plate 220 is disposed below the middle plate 250, such that the top surface 222 of the lower plate 220 is disposed on the bottom surface 254 of the middle plate 250. The upper plate 210, the middle plate 250, and the lower plate 220 are aligned with one another, such that the outer edges of each of the upper plate 210, the middle plate 250, and the lower plate 220 are aligned with each other. Each of the upper plate 210, the middle plate 250, and the lower plate 220 have the same central axis disposed through the center of each of the upper plate 210, the middle plate 250, and the lower plate 220.

Subsequent to being positioned adjacent one another, the upper plate 210, the middle plate 250, and the lower plate 220 are aligned with one another, such that the first gas input 211 is aligned with a portion of the first upper channel 256 and the second gas input 213 is aligned with a portion of the second upper channel 258. Each of the first lower channels 262a formed in the middle plate 250 are aligned with one of the first passages 226a formed in the lower plate 220. Each of the second lower channels 262b formed in the middle plate 250 are aligned with one of the second passages 226b. The first gas input 211 and the second gas input 213 are used as reference points on the upper plate 210 to align the upper plate 210. The first upper channel 256, the second upper channel 258, the first lower channels 262a, and the second lower channels 262b are used as reference points in the middle plate 250 to align the middle plate 250. The first passages 226a and the second passages 226b are used as reference points in the lower plate 220 to align the lower plate 220.

The upper plate 210, the middle plate 250, and the lower plate 220 are aligned such that during a subsequent operation, such as drilling additional passages (e.g., main passages 350) the drilled passages do not intersect any of the previously formed features within the upper plate 210, the middle plate 250, or the lower plate 220. Therefore, the upper plate 210, the middle plate 250, and the lower plate 220 are aligned such that the main passages 350 will not intersect any of the first gas input 211, the second gas input 213, the first upper channel 256, the second upper channel 258, the first lower channels 262a, the first connection passages 260, the second connection passages 261, the second lower channels 262b, the first passages 226a, or the second passages 226b. In one embodiment, as illustrated in FIG. 4B, the main passages 350 include a main passage opening (e.g., open region), which is defined by the surface of the main passages 350, that has a linear cylindrical shape as the main passages 350 extend from the top surface of the upper plate 210 to the bottom surface of the lower plate 220. In this configuration, the linear cylindrical shape of main passage opening can include a circular, oval or prism shape that extends along a line that is parallel to a first direction. In one embodiment, the first direction can be perpendicular to top surface 212 of the upper plate 210 and/or perpendicular to bottom surface 224 of the lower plate 220. The linear cylindrical shape of the main passage opening is straight and does not include any bends, alcoves, recesses or curvature, which will improve a user's ability to clean the manufactured assembly prior to use and also prevent the collection of particles entrained in a gas stream that flows through the main passages 350 during normal device processing processes.

Bonding the top surface 222 of the lower plate 220 to the bottom surface 254 of the middle plate 250 and the top surface 252 of the middle plate 250 to a bottom surface 214 of the upper plate 210 forms a coupled gas distribution apparatus. As described herein, one of the one or more first lower channels 262a of the middle plate 250 is positioned adjacent to the first passages 226a of the lower plate 220, wherein the first passages 226a are in fluid communication with at least one of the first lower channels 262a. Similarly, one of the one or more second lower channels 262b of the middle plate 250 is positioned adjacent to the second passages 226b of the lower plate 220, wherein the second passages 226b are in fluid communication with at least one of the second lower channels 262b. In embodiments in which the first gas input 211 and the second gas input 213 are formed through the upper plate 210, the first gas input 211 is aligned with the first upper channel 256 and the second gas input 213 is aligned with the second upper channel 258. The first gas input 211, the first upper channel 256, the first connection passages 260, the first lower channels 262a, and the first passages 226a form a first process gas fluid path. The second gas input 213, the second upper channel 258, second connection passages 261, the second lower channels 262b, and the second passages 226b form a second process gas fluid path. The first process gas fluid path fluidly connects the second process gas source 118 to the processing volume 125 and the second process gas fluid path fluidly connects the third process gas source 120 to the processing volume 125.

The bonding of the upper plate 210, the middle plate 250, and the lower plate 220 during the second manufacturing operation 1104 can include brazing or diffusion bonding. Brazing is a joining process in which a filler metal is flown into the space between the upper plate 210 and the middle plate 250 or the lower plate 220 and the middle plate 250. The filler metal may be an aluminum, silver, nickel, or copper material. The filler metal materials may additionally be metal alloys, such as aluminum or nickel based alloys. In some embodiments, the brazing process is a vacuum brazing process to prevent the oxidation and corrosion of the metals while also allowing for increased control of the filler melting temperature.

Diffusion bonding is a process that is used to join the upper plate 210 and the middle plate 250 or the lower plate 220 and the middle plate 250 by heating the plate assembly while each plate is in contact with one another. The molecules of the upper plate 210, the lower plate 220, and the middle plate 250 intersperse along the contacting surfaces, such that the upper plate 210, the lower plate 220, and the middle plate are joined to form the coupled gas distributor apparatus 700. In some embodiments, the diffusion bonding process is performed under vacuum to reduce oxidation and corrosion of the plates and increase control of the diffusion temperatures of the plates.

After bonding the upper plate 210, the middle plate 250, and the lower plate 220 the third manufacturing operation 1106 (FIG. 4B) is performed. The third manufacturing operation 1106 includes forming the main passages 350 (FIGS. 4B and 9-10) through the coupled gas distributor apparatus 700. The main passages 350 are machined between the top surface 212 of the upper plate 210 and the bottom surface 224 of the lower plate 220 by drilling. The main passages 350 are machined between the first upper channel 256, the second upper channel 258, the first connection passages 260, the second connection passages 261, the first lower channels 262a, the second lower channels 262b, the first passages 226a, and the second passages 226b, and thus are fluidly isolated therefrom. The main passages 350 do not intersect or overlap any of the first upper channel 256, the second upper channel 258, the first connection passages 260, the second connection passages 261, the first lower channels 262a, the second lower channels 262b, the first passages 226a, and the second passages 226b. The main passages 350 are formed in any suitable pattern, such as those described herein. During the third manufacturing operation 1106 the first passages 226a and the second passages 226b formed in the lower plate 220 may be capped or plugged to prevent contaminants and particle from making their way into the interior region of the gas distribution apparatus 150.

After the formation of the main passages 350, the gas distribution apparatus is deburred and cleaned, such that the main passages 350 are smoothed and cleaned.

FIG. 4A illustrates a partial cross-sectional view of a gas distributor apparatus 150 after a second manufacturing operation 1104. The gas distributor apparatus 150 shown in FIG. 4A is a coupled gas distributor apparatus 700. The upper plate 210, the middle plate 250, and the lower plate 220 are coupled together to form a gas distributor apparatus, such as the gas distributor apparatus 150. The upper plate 210, the middle plate 250, and the lower plate 220 are similar to the upper plate 210, the middle plate 250, and the lower plate 220 shown in the second apparatus stage 202 of FIG. 3.

The bottom surface 214 of the upper plate 210 is coupled to the top surface 252 of the middle plate 250. The bottom surface 254 of the middle plate 250 is coupled to the top surface 222 of the lower plate 220. Each of the first lower channels 262a are aligned with each of the first passages 226a, such that the first lower channels 262a are fluidly connected to the first passages 226a. Each of the second lower channels 262b are aligned with each of the second passages 226b, such that the second lower channels 262b are fluidly connected to the second passages 226b.

The upper plate 210 at least encloses the first upper channel 256 and the second upper channel 258. However, the upper plate 210 will typically enclose all of the recessed features formed in the middle plate 250, such as the upper channels 256, 258, arcs 312, outer semicircular passage 314 and other interconnecting portions. Before the coupling of the upper plate 210 to the middle plate 250, the first upper channel 256 and the second upper channel 258 could be described as trenches within the top surface 252 of the middle plate 250. The coupling of the upper plate 210 to the middle plate 250 provides a top wall of the first upper channel 256 and the second upper channel 258. The upper plate 210 and the middle plate 250 together enclose first upper channel 256 and the second upper channel 258, such that both of the first upper channel 256 and the second upper channel 258 are able to be filled with process gases without leakage between the first upper channel 256 and the second upper channel 258. In some embodiments, the upper plate 210 may have similar trenches formed on the bottom surface 214 thereof, which align with the first upper channel 256 and the second upper channel 258.

The lower plate 220 encloses the first lower channels 262a and the second lower channels 262b. Before the coupling of the middle plate 250 and the lower plate 220, the first lower channels 262a and the second lower channels 262b could be described as trenches within the bottom surface 254 of the middle plate 250. The coupling of the upper plate 210 to the middle plate 250 provides a bottom wall of the first lower channels 262a and the second lower channels 262b. The lower plate 220 and the middle plate 250 together enclose the first lower channels 262a and the second lower channels 262b, such that both of the first lower channels 262a and the second lower channels 262 are able to be filled with process gases without leakage between the first lower channels 262a and the second lower channels 262b. In some embodiments, the lower plate 220 may have similar trenches formed on the top surface 222 thereof, which align with the first lower channels 262a and the second lower channels 262.

In some embodiments, the bottom surface 214 of the upper plate 210 is coupled to the top surface 252 of the middle plate 250 by brazing or diffusion bonding. In some embodiments, the bottom surface 254 of the middle plate 250 is also coupled to the top surface 222 of the lower plate 220 by brazing or diffusion bonding. Brazing is a joining process in which the middle plate 250 is joined to the upper plate 210 by allowing a filler metal to flow into the space between the upper plate 210 and the middle plate 250. Similarly, brazing joins the middle plate 250 and the lower plate 220 by allowing a filler metal to flow into the space between the middle plate 250 and the lower plate 220. The filler metal may be any one of aluminum, copper, silver, nickel, or alloys of the metals described herein. In some embodiments, the filler material is an aluminum-silicon alloy with a melting temperature slightly below the melting temperature of the metal used to form the upper plate 210, the middle plate 250, and the lower plate 220. When diffusion bonding is utilized, the upper plate 210 and the lower plate 220 are joined to the middle plate 250 by heating the upper plate 210, the lower plate 220, and the middle plate 250 while the upper plate 210, the lower plate 220, and the middle plate 250 are in contact with one another. The molecules of the upper plate 210, the lower plate 220, and the middle plate 250 intersperse along the contacting surfaces, such that the upper plate 210, the lower plate 220, and the middle plate are joined to form the coupled gas distributor apparatus 700.

The utilization of all three of the upper plate 210, the middle plate 250, and the lower plate 220 allows for increasingly complex upper and lower channel geometries, while reducing the difficulty of forming the channels. All three of the upper plate 210, the middle plate 250, and the lower plate 220 may be bonded simultaneously, such that only one alignment and bonding operation is utilized. At this stage of the manufacturing process, the bonding process, which allows the upper plate 210, the middle plate 250, and the lower plate 220 to be physically bonded so that they form an inseparable assembly, creates a partially formed bonded assembly that will require additional manufacturing operations, which are described below, to form the final gas distributor apparatus 150.

The width of the first upper channel 256 and the width of the second upper channel 258 are about 2 mm to about 10 mm, such as about 3 mm to about 8 mm, such as about 4 mm to about 6 mm, such as about 5 mm. The width of the first and second upper channels 256, 258 regulates pressure drop within the first and second upper channels 256, 258. The width of the first and second upper channels 256, 258 must be large enough to not allow pressure drop to increase past a threshold, while small enough to enable adequate passage density through the middle plate 250. The depth 701 of the first upper channel 256 and the depth 701 of the second upper channel 258 is about 2 mm to about 10 mm, such as about 3 mm to about 8 mm, such as about 4 mm to about 6 mm, such as about 5 mm. In some embodiments, the depth 701 of the first upper channel 256 and the second upper channel 258 is less than about 8 mm, such as less than about 6 mm, such as less than about 5 mm. In some embodiments, the ratio of the thickness of the middle plate 250 to the depth 701 of the first upper channel 256 and the depth 701 of the second upper channel 258 is about 5:1 to about 2:1, such as about 4:1 to about 3:1.

The diameter 702 of the first connection passages 260 and the diameter 702 of the second connection passages 261 is about 1 mm to about 7 mm, such as about 2 mm to about 6 mm, such as about 3 mm to about 5 mm. The diameter of the first and second connection passages 260, 261 regulates pressure drop within the first and second connection passages 260, 261. The diameter of the first and second connection passages 260, 261 must be large enough to not allow pressure drop to increase past a threshold which caused process gas flow delay, while small enough to enable adequate passage density through the middle plate 250. The length 703 of the first connection passages 260 and the second connection passages 261 is about 1 mm to about 5 mm, such as about 2 mm to about 4 mm, such as about 2 mm to about 3 mm. The ratio of the thickness of the middle plate 250 to the length 703 of either of the first connections passages 260 or the second connection passages 261 is about 15:1 to about 5:1, such as about 10:1 to about 6:1. The length 703 of the first connection passages 260 and the second connection passages 261 established a back pressure to improve distribution uniformity.

The width 704 of the first lower channels 262a and the width 704 of the second lower channels 262b is about 2 mm to about 10 mm, such as about 3 mm to about 8 mm, such as about 4 mm to about 6 mm. The width 704 of the first lower channels 262a and the second lower channels 262b may be the same as the width of the first and second upper channels 256, 258. The width 704 serves to regulate pressure drop within the first lower channels 262a and the second lower channels 262b, while enabling adequate passage density through the middle plate 250. The depth 705 of the first lower channels 262a and the depth 705 of the second lower channels 262b is about 2 mm to about 10 mm, such as about 3 mm to about 8 mm, such as about 3 mm to about 5 mm, such as about 3 mm. In some embodiments, the depth of the lower channels is less than about 5 mm, such as less than about 3 mm.

The width 706 of the first passages 226a and the width 706 of the second passages 226b is about 0.1 mm to about 6 mm, such as about 0.5 mm to about 5 mm, such as about 1 mm to about 5 mm, such as about 1 mm to about 3 mm. The length of the first passages 226a and the second passages 226b span the entire thickness of the lower plate 220. The width 706 of the first passages 226a and the width 706 of the second passages 226b is restricted in order to build up back-pressure within the first lower channels 262a and the second lower channels 262b. The back-pressure assists in distributing process gases through the first lower channels 262a and the second lower channels 262b, so that process gases are distributed more evenly through the first passages 226a and the second passages 226b.

FIG. 4B illustrates a partial cross-sectional view of a gas distributor apparatus 150 through a first plane after a third manufacturing operation 1106. The first plane may be any one of the first planes 330, 430, 530, or 630. The gas distributor apparatus 150 of FIG. 4B is similar to the gas distributor apparatus shown in FIG. 4A except in FIG. 4B the main passages 350 have been formed and are shown through the upper plate 210, middle plate 250 and lower plate 220. FIG. 4A is a view of the gas distributor apparatus 150 from a second plane, such as the second planes 340, 440, 540, or 640. The second planes 340, 440, 540, and 640 will be similar to those shown in FIG. 4A even after the formation of the main passages 350, because the main passages 350 do not intersect the first upper channel 256, the second upper channel 258, the first connection passages, the second connection passages, the first lower channels 262a, the second lower channels 262b, the first passages 226a, and the second passages 226b. The gas distributor apparatus 150 of FIG. 4B further illustrates a plurality of main passages 350.

The plurality of main passages 350 are apertures, which are disposed through the entire thickness of the gas distributor apparatus 150. The main passages 350 are disposed through the upper plate 210, the middle plate 250, and the lower plate 220. The upper plate 210 includes a top section 804 of the main passages 350. The middle plate 250 includes a middle section 806 of the main passages 350. The lower plate 220 includes a bottom section 808 of the main passages 350. Each of the top section 804, the middle section 806, and the bottom section 808 are aligned to form a linear passage disposed through the gas distributor apparatus 150. The main passages 350 are vertically oriented and parallel to one another. In embodiments described herein, the main passages 350 are parallel to each of the first connection passages 260, the second connection passages 261, the first passages 226a, and the second passages 226b. Each of the main passages 350 has a diameter 802 of less than about 10 mm, such as about 1 mm to about 10 mm, such as about 2 mm to about 8 mm, such as about 3 mm to about 7 mm. The diameter 802 of the main passages 350 is greater than the diameter of any of the first connection passages 260, the second connection passages 261, the first passages 226a, or the second passages 226b. The smaller diameter 802 of the main passages 350 compared to the diameters of the first connection passages 260, the second connection passages 261, the first passages 226a, or the second passages 226b enables sufficient backpressure above the gas distributor apparatus 150 to evenly distribute the process gas.

Middle Plate Configuration Examples

Figure 5A:
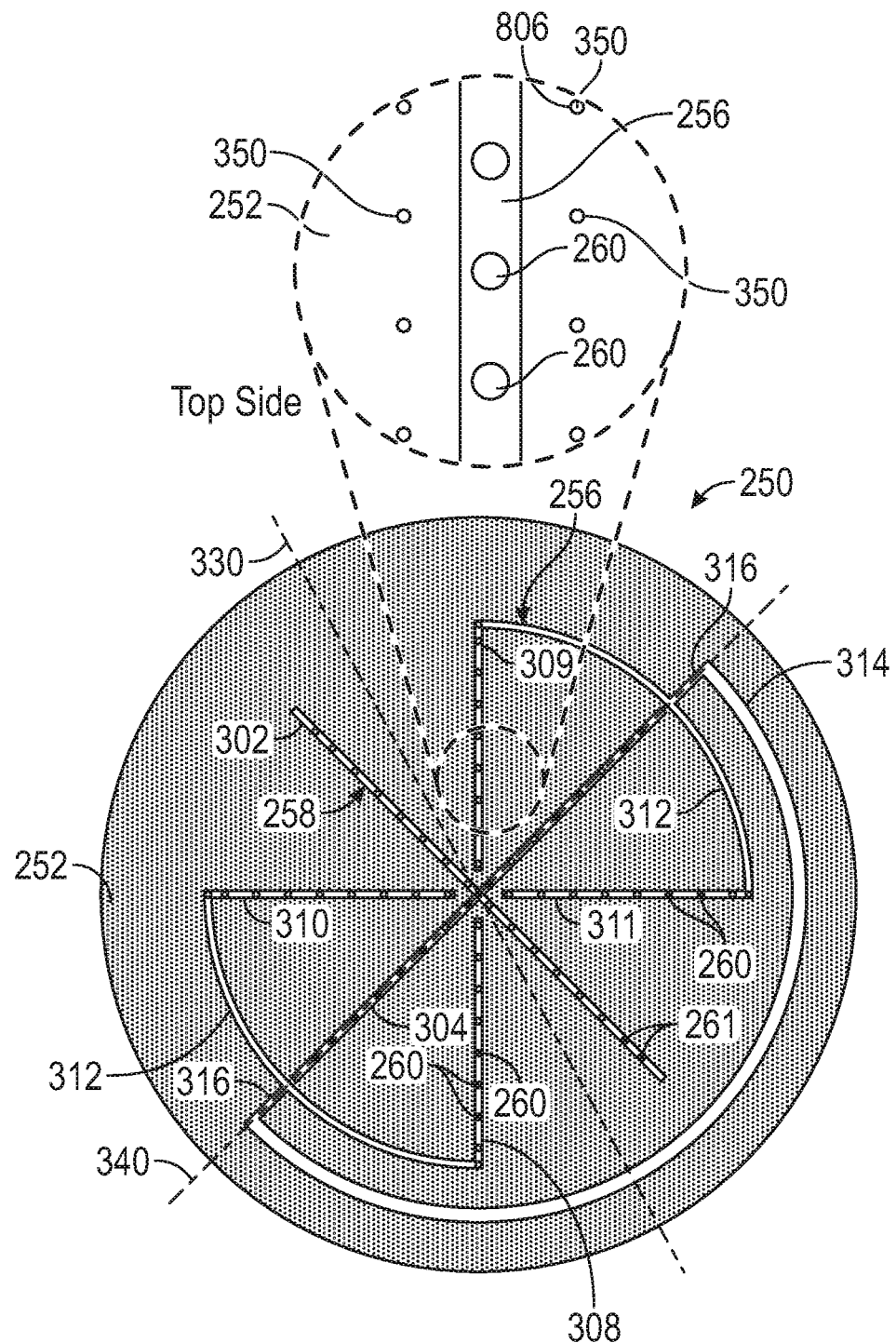
FIG. 5A illustrates a top plan view of a middle plate of the gas distributor apparatus according to a first embodiment.

FIGS. 5A-8B illustrate various configurations of the middle plate 250 that can be used to form a portion of the gas distributor apparatus 150. FIG. 5A illustrates a top plan view of a middle plate 250 of the gas distributor apparatus 150 according to a first embodiment. The top surface 252 of the middle plate 250 is illustrated in FIG. 5A. The top surface 252 of the middle plate 250 is a circular surface and includes the first upper channel 256, the second upper channel 258, the first connection passages 260, and the second connection passages 261.

The first upper channel 256 is formed in an X shape and includes two arcs 312 to allow the even distribution of gases to the first connection passages 260 during use. In one embodiment, the two arcs 312 are quarter circle channels and are attached at adjacent ends of the X shape of the first upper channel 256. In the embodiment described herein, the first upper channel 256 includes a first portion 308, a second portion 309, a third portion 310, and a fourth portion 311. The first portion 308 and the second portion 309 are radially aligned with one another and extend radially outward from the center of the middle plate 250 in opposite directions. The third portion 310 and the fourth portion 311 are radially aligned with one another and extend radially outward from the center of the middle plate 250 in opposite directions. Each of the first portion 308, the second portion 309, the third portion 310, and the fourth portion 311 include a plurality of first connection passages 260 disposed therein.

The first portion 308 and the second portion 309 are disposed at an angle to the third portion 310 and the fourth portion 311. In the embodiment described herein, the first portion 308 and the second portion 309 are disposed at an angle of about 80 degrees to about 100 degrees to the third portion 310 and the fourth portion 311, such that the first portion 308 and the second portion 309 are disposed perpendicular to one another. None of the first portion 308, the second portion 309, the third portion 310, or the fourth portion 311 are in direct contact with one another and none of the first portion 308, the second portion 309, the third portion 310, or the fourth portion 311 intersect the radial center of the middle plate 250.

The first portion 308 and the fourth portion 311 are attached to opposite ends of a first of the two arcs 312. The distally outward end of each of the first portion 308 and the fourth portion 311 are connected to one of the two arcs 312. The second portion 309 and the third portion 310 are attached to opposite ends of a second of the two arcs 312. The distally outward end of each of the second portion 309 and the third portion 310 are connected to the second of the two arcs 312. Each of the arcs 312 may be connected to an outer semicircular passage 314. The semicircular passage 314 is disposed radially outwards of the two arcs 312. The semicircular passage 314 is connected to each of the two arcs 312 by a radial connection portion 316. The radial connection portion 316 is a radially disposed channel formed between each of the two arcs 312 and the semicircular passage 314. The radial connection portion 316 is connected to the center of each of the two arcs 312 and the distal ends of the semicircular passage 314 to allow for a uniform distribution of gas through the semicircular passage 314, through the arcs 312, and through each of the portions 308-311 and the first connection passages 260 during processing.

The second upper channel 258 is also formed in an X shape, such that the second upper channel 358 includes a first cross stroke 302 and a second cross stroke 304. The first cross stroke 302 and the second cross stroke 304 are channels disposed about perpendicular to each other across the top surface 252 of the middle plate 250, such that the first cross stroke 302 and the second cross stroke 304 intersect at an angle of between about 80 degrees and about 100 degrees, such as about 85 degrees to about 95 degrees. The first cross stroke 302 and the second cross stroke 304 intersect at the radial center of the top surface 252 of the middle plate 250. Each of the first cross stroke 302 and the second cross stroke 304 include a plurality of second connection passages 261 disposed therein, and are each isolated from the arcs 312 and each of the portions 308-311 by a wall.

The first plane 330 is the plane through the middle plate 250, which intersects the smallest amount of either of the first upper channel 256 or the second upper channel 258. The second plane 340 is the plane through the middle plate 250, which intersects the length of a portion of the first upper channel 256.

The middle plate 250 includes a plurality of main passages 350 formed through the middle plate 250. The main passages 350 extend through the middle plate 250 and are disposed around, but do not intersect the first upper channel 256 or the second upper channel 258.

Figure 5B:
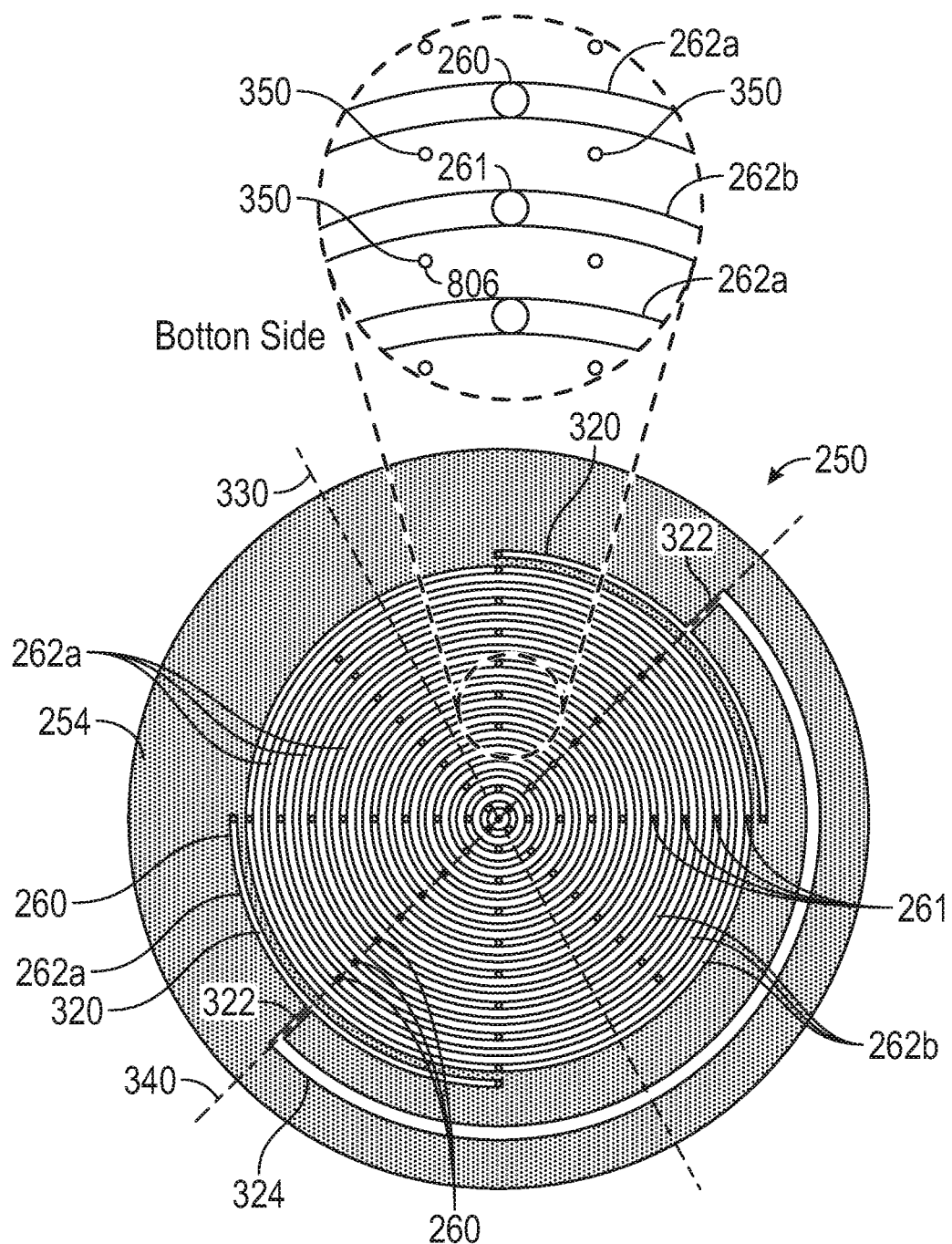
FIG. 5B illustrates a bottom plan view of a middle plate of the gas distributor apparatus according to a first embodiment.

FIG. 5B illustrates a bottom plan view of a middle plate 250 of the gas distributor apparatus 150 according to a first embodiment. The bottom plan view illustrates the bottom surface 254 of the middle plate 250 according to a first embodiment. The bottom surface 254 of the middle plate 250 includes a plurality of first lower channels 262a and a plurality of second lower channels 262b formed therein.

The first lower channels 262a includes a plurality of concentric rings disposed on the bottom surface 254. The second lower channels 262b also include a plurality of concentric rings disposed on the bottom surface 254. In one embodiment, the first lower channels 262a and the second lower channels 262b are concentric with one another and are patterned such that the first lower channels 262a are in an alternating pattern with the second lower channels 262b. Each of the first lower channels 262a include one or more first connection passages 260. Each of the second lower channels 262b include one or more second connection passages 261. Adjacent tangential points of the first lower channels 262a and the second lower channels 262b are parallel to each other in a first direction, wherein the first direction is parallel to the bottom surface 254 of the middle plate 250.

Radially outward of the outermost ring of first lower channels 262a and the second lower channels 262b are two arcs 320 similar to the two arcs 312, but disposed on the bottom surface 254. The two arcs 320 are connected to an outer semicircular passage 324. In one configuration, the semicircular passage 324 is disposed radially outwards of the two arcs 320. The semicircular passage 324 is connected to each of the two arcs 320 by a radial connection portion 322. The radial connection portion 322 is a radially disposed channel formed between each of the two arcs 320 and the semicircular passage 324. The radial connection portion 322 is connected to the center of each of the two arcs 320 and the distal ends of the semicircular passage 324 to allow for a uniform distribution of gas there through. The two arcs 320, the semicircular passage 324, and the radial connection portions 322 on the bottom surface 254 are mirror images of the arcs 312, the semicircular passage 314, and the radial connection portions 316 on the top surface 242 of the middle plate 250.

The middle plate 250 further includes a plurality of main passages 350 formed there through. The main passages 350 extend through the middle plate 250 and are disposed around, but do not intersect the first lower channels 262a and the second lower channels 262b. There may be a plurality of main passages 350 disposed between each ring of the first lower channels 262a and the second lower channels 262b.

Figure 6A:
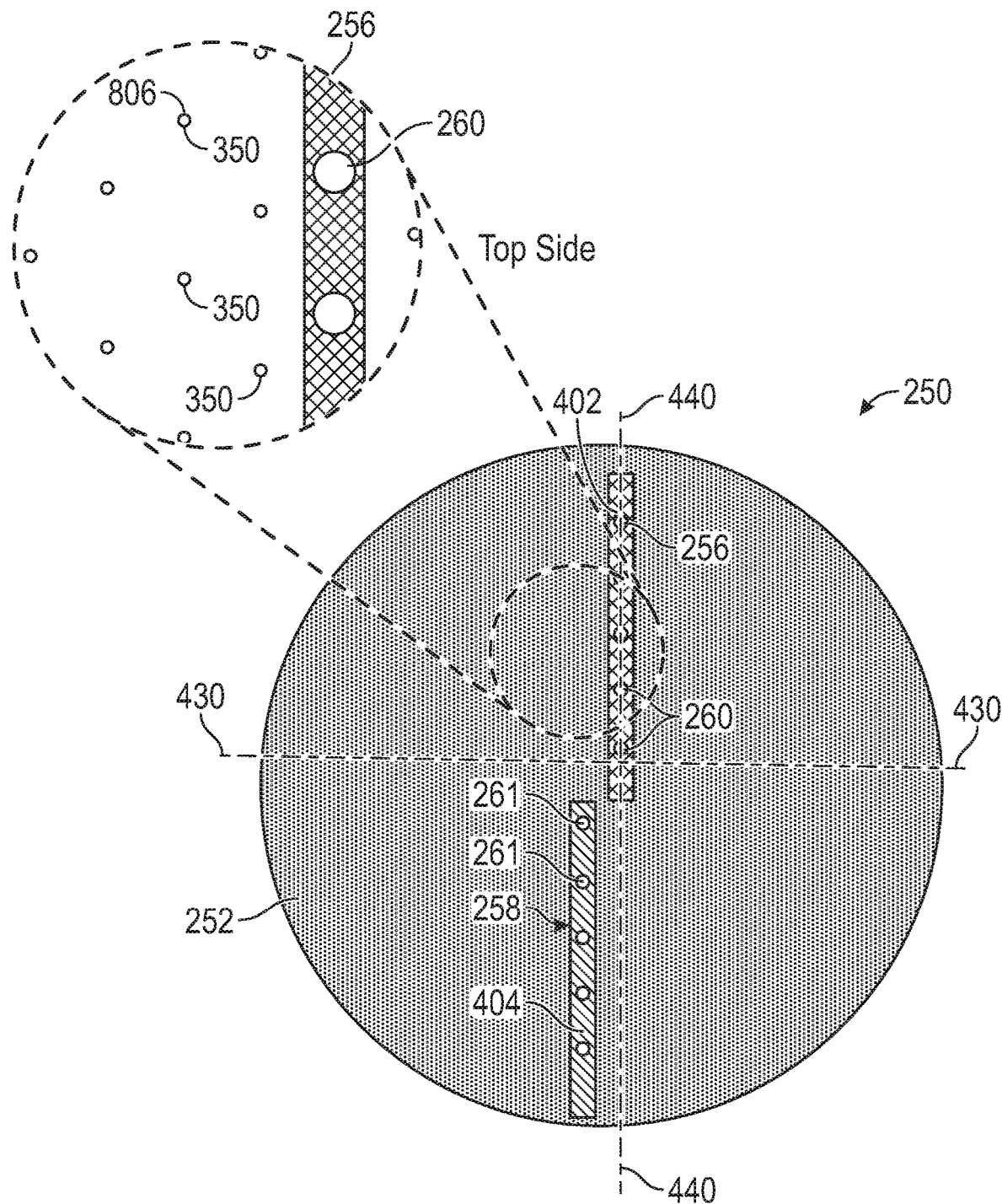
FIG. 6A illustrates a top plan view of a middle plate of the gas distributor apparatus according to a second embodiment.

FIG. 6A illustrates a top plan view of a middle plate 250 of the gas distributor apparatus 150 according to a second embodiment. The top plan view illustrates the top surface 252 of the middle plate 250. The top surface 252 of the middle plate 250 is a circular surface and includes the first upper channel 256, the second upper channel 258, the first connection passages 260, and the second connection passages 261.

The first upper channel 256 is a first off radius portion 402. The first off radius portion 402 is a linear portion, which is slightly offset from the radius of the top surface 252 of the middle plate 250. The first off radius portion 402 extends over a portion of the diameter of the top surface 252, such as less than half of the diameter of the top surface 252. The first upper channel 256 includes the first connection passages 260 disposed therein.

The second upper channel 258 is a second off radius portion 404. The second off radius portion 404 is a linear portion, which is slightly offset from the radius of the top surface 252 of the middle plate 250. The second off radius portion 404 extends over a portion of the diameter of the top surface 252, such as less than half of the diameter of the top surface 252. The second upper channel 258 includes the second connection passages 261 disposed therein. The second off radius portion 404 is parallel to the first off radius portion 402.

The first plane 430 is the plane through the middle plate 250, which intersects the smallest amount of either of the first upper channel 256 or the second upper channel 258. The second plane 440 is the plane through the middle plate 250, which intersects the length of a portion of the first upper channel 256, such that the second plane 440 is passes through the length of the first off radius portion 402.

The middle plate 250 includes a plurality of main passages 350 formed through the middle plate 250. The main passages extend from the top surface 252 to the bottom surface 254. The main passages 350 extend through the middle plate 250 and are disposed around, but do not intersect the first upper channel 256 or the second upper channel 258.

Figure 6B:
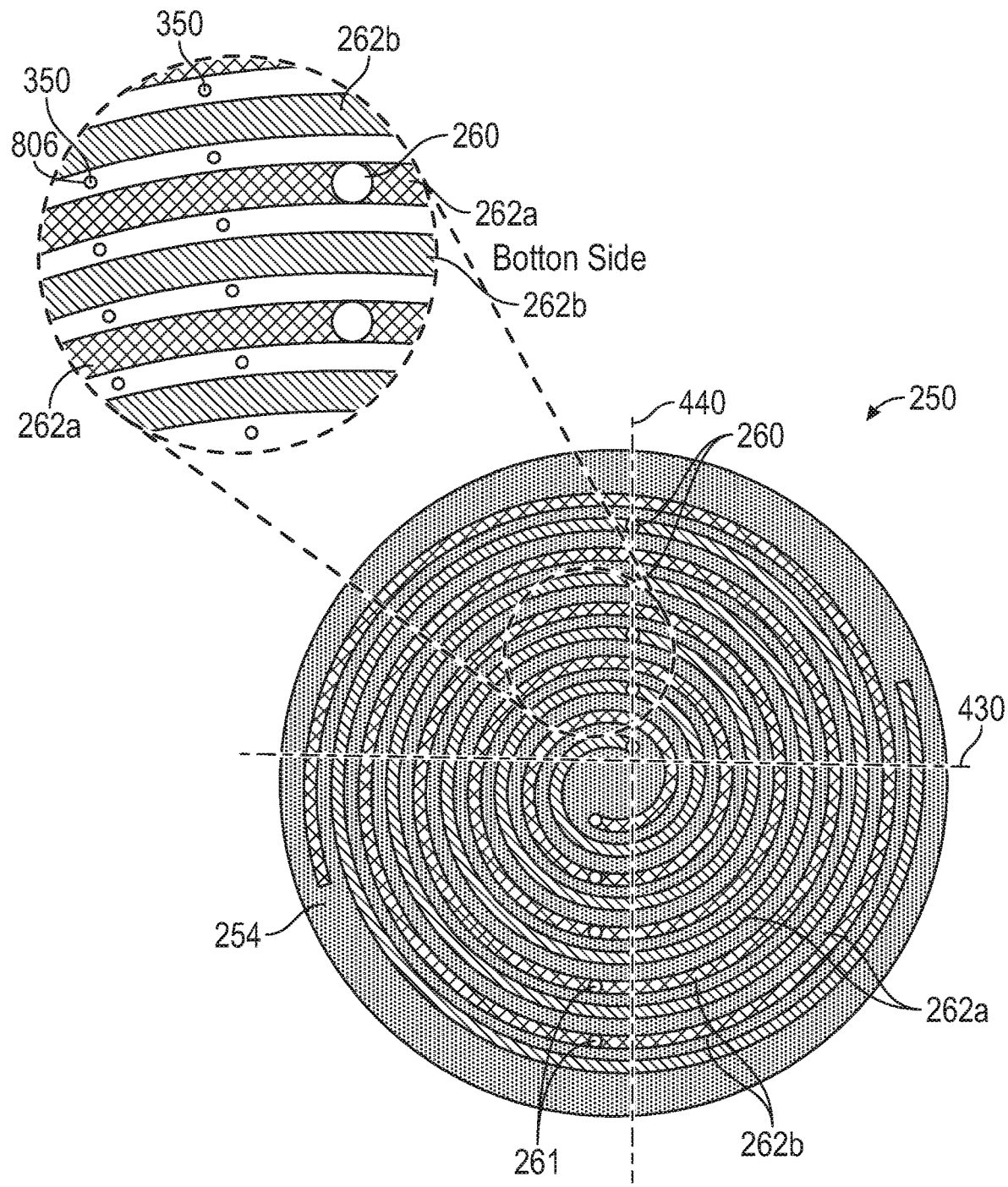
FIG. 6B illustrates a bottom plan view of a middle plate of the gas distributor apparatus according to a second embodiment.

FIG. 6B illustrates a bottom plan view of a middle plate 250 of the gas distributor apparatus 150 according to a second embodiment. The second embodiment illustrates the bottom surface 254 of the middle plate 250. The bottom surface 254 of the middle plate 250 includes a first lower channel 262a and a second lower channel 262b formed therein.

The first lower channel 262a is a spiral shape, such that the first lower channel 262a spirals radially outward from a central portion of the bottom surface 254. The first lower channel 262a increases in diameter continuously as the spiral radiates from a central position. The second lower channel 262b is also a spiral shape, such that the second lower channel 262b spirals radially outward from a central portion of the bottom surface 254. The second lower channel 262b increases in diameter continuously as the spiral radiates from a central position. The first lower channel 262a and the second lower channel 262b spiral in opposite directions. In one embodiment, the first lower channel 262a radiates outward in a clockwise manner, while the second lower channel 262b radiates outward in a counterclockwise manner. Conversely, in another embodiment, the first lower channel 262a radiates outward in a counterclockwise manner, while the second lower channel 262b radiates outward in a clockwise manner.

The first connection passages 260 connect the first lower channel 262a and the first upper channel 256, such that the first connection passages 260 provide a fluid delivery path from the first upper channel 256 to the first lower channel 262a. The second connection passages 261 connect the second lower channel 262b and the second upper channel 258, such that the second connection passages 261 provide a fluid delivery path from the second upper channel 258 to the second lower channel 262b.

The middle plate 250 includes a plurality of main passages 350 formed through the middle plate 250 and extending from the top surface 252 to the bottom surface 254. The main passages 350 extend through the middle plate 250 and are disposed around, but do not intersect the first lower channel 262a or the second lower channel 262b. The main passages 350 are formed between each of the first lower channel 262a and the second lower channel 262b.

Figure 7A:
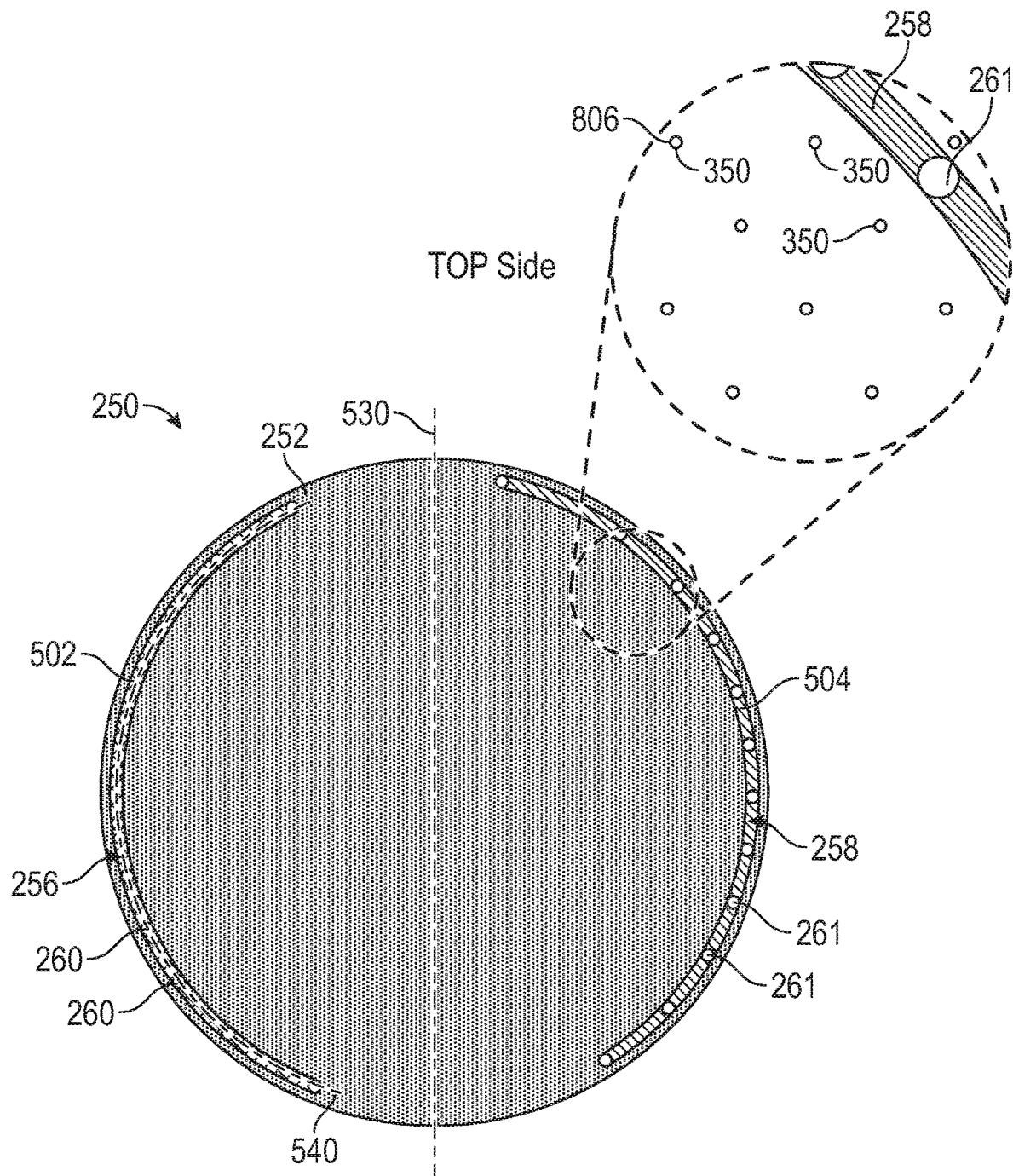
FIG. 7A illustrates a top plan view of a middle plate of the gas distributor apparatus according to a third embodiment.

FIG. 7A illustrates a top plan view of a middle plate 250 of the gas distributor apparatus 150 according to a third embodiment. The top plan view illustrates the top surface 252 of the middle plate 250. The top surface 252 of the middle plate 250 is a circular surface and includes the first upper channel 256, the second upper channel 258, the first connection passages 260, and the second connection passages 261.

The first upper channel 256 includes an arc 502. The arc 502 of the first upper channel 256 is disposed on an outer portion of the top surface 252 of the middle plate 250. The arc 502 is a minor circular arc, such that the arc 502 subtends an angle of a circle that is less than 180 degrees. The arc 502 subtends an angle of a circle that is about 100 degrees to about 170 degrees, such as about 110 degrees to about 160 degrees. The second upper channel 258 is similar to the first upper channel 256. The second upper channel 258 includes an arc 504. The arc 504 of the second upper channel 258 is disposed on an outer portion of the top surface 252 of the middle plate 250. The arc 504 is a minor circular arc, such that the arc 504 subtends an angle of a circle that is less than 180 degrees. The arc 504 subtends an angle of a circle that is about 100 degrees to about 170 degrees, such as about 110 degrees to about 160 degrees.

The first upper channel 256 and the second upper channel 258 are disposed on opposite sides of the top surface 252 of the middle plate 250, such that the concave sides of each of the first upper channel 256 and the second upper channel 258 face each other. Each of the arc 502 and the arc 504 of the first upper channel 256 and the second upper channel 258 respectively are centered about the same central point on the top surface 252.

The first upper channel 256 includes a plurality of first connection passages 260 disposed therein. The first connection passages 260 extend from the bottom of the first upper channel 256 and are spaced throughout the arc 502 of the first upper channel 256. The second upper channel 258 includes a plurality of second connection passages 261 disposed therein. The second connection passages 261 extend from the bottom of the second upper channel 258 and are spaced throughout the arc 504 of the second upper channel 258.

The middle plate 250 includes a plurality of main passages 350 formed through the middle plate 250. The main passages 350 extend through the middle plate 250 and are disposed around, but do not intersect the first upper channel 256 or the second upper channel 258.

The first plane 530 is the plane through the middle plate 250, which intersects the smallest amount of either of the first upper channel 256 or the second upper channel 258. The second plane 540 is the plane through the middle plate 250, which intersects the length of a portion of the first upper channel 256, such that the second plane 540 passes through the length of the arc 502.

Figure 7B:
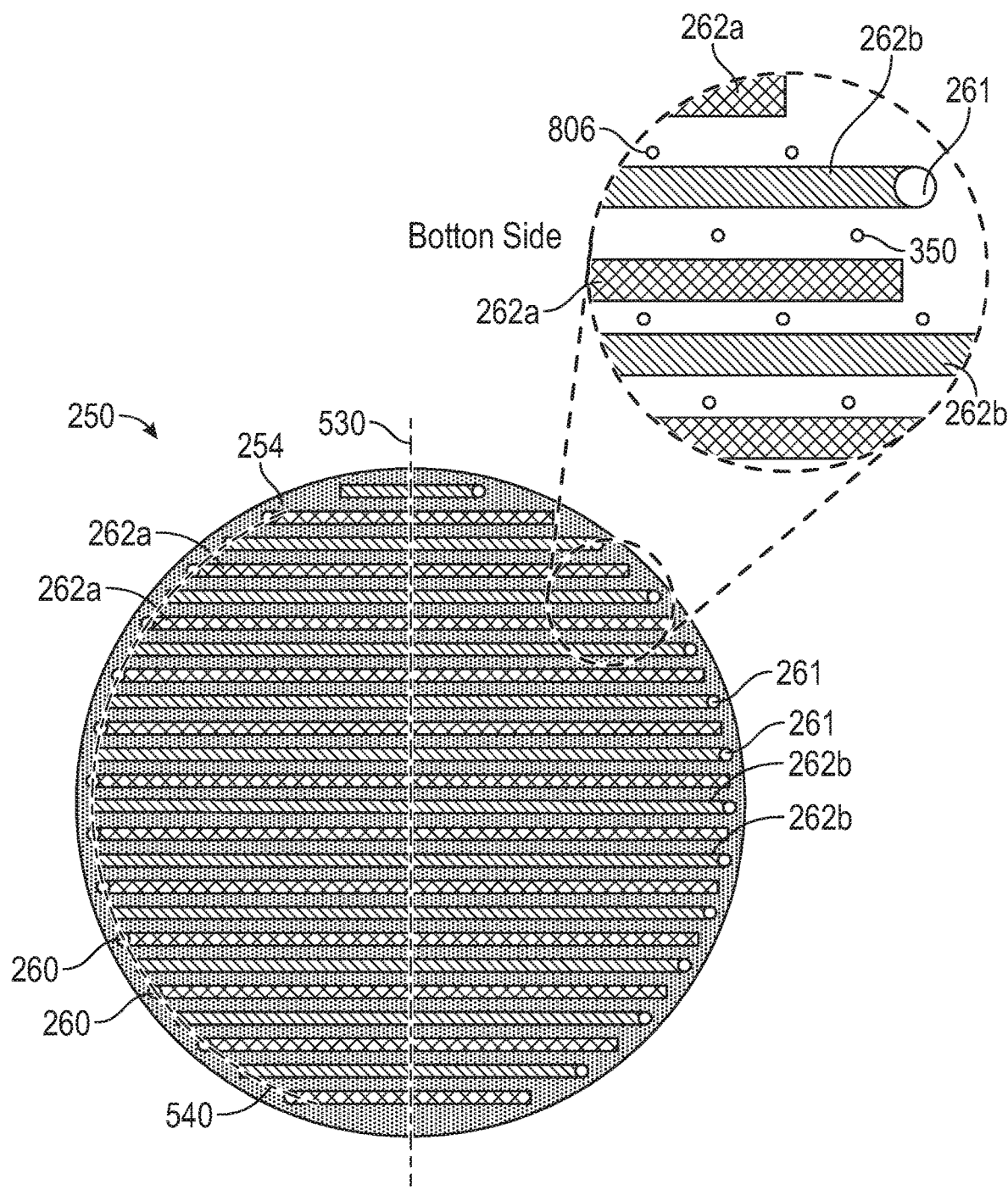
FIG. 7B illustrates a bottom plan view of a middle plate of the gas distributor apparatus according to a third embodiment.

FIG. 7B illustrates a bottom plan view of a middle plate 250 of the gas distributor apparatus 150 according to a third embodiment. The third embodiment illustrates the bottom surface 254 of the middle plate 250. The bottom surface 254 of the middle plate 250 includes a plurality of first lower channels 262a and a plurality of second lower channels 262b formed therein.

The first lower channels 262a are partial chords across the bottom surface 254 of the middle plate 250. The first lower channels 262a extend from the bottom of each of the first connection passages 260 across the bottom surface 254 towards the second connection passages 261. Each of the first lower channels 262a of FIG. 7B are parallel to one another.

The second lower channels 262b are partial chords across the bottom surface 254 of the middle plate 250. The second lower channels 262b extend from the bottom of each of the second connection passages 261 across the bottom surface 254 towards the first connection passages 260. Each of the second lower channels 262b of FIG. 7B are parallel to one another in a first direction, wherein the first direction is parallel to the bottom surface 254 of the middle plate 250. Each of the second lower channels 262b are also parallel to each of the first lower channels 262a of FIG. 7B.

The first lower channels 262a and the second lower channels 262b are interleaved and are formed in an alternating pattern, such that a first lower channel 262a is formed between each adjacent pair of second lower channels 262b and a second lower channel 262b is formed between each adjacent pair of first lower channels 262a.

The middle plate 250 includes a plurality of main passages 350 formed through the middle plate 250. The main passages 350 extend through the middle plate 250 and are disposed around, but do not intersect the first lower channel 262a or the second lower channel 262b. The main passages 350 are formed between each of the first lower channel 262a and the second lower channel 262b.

Figure 8A:
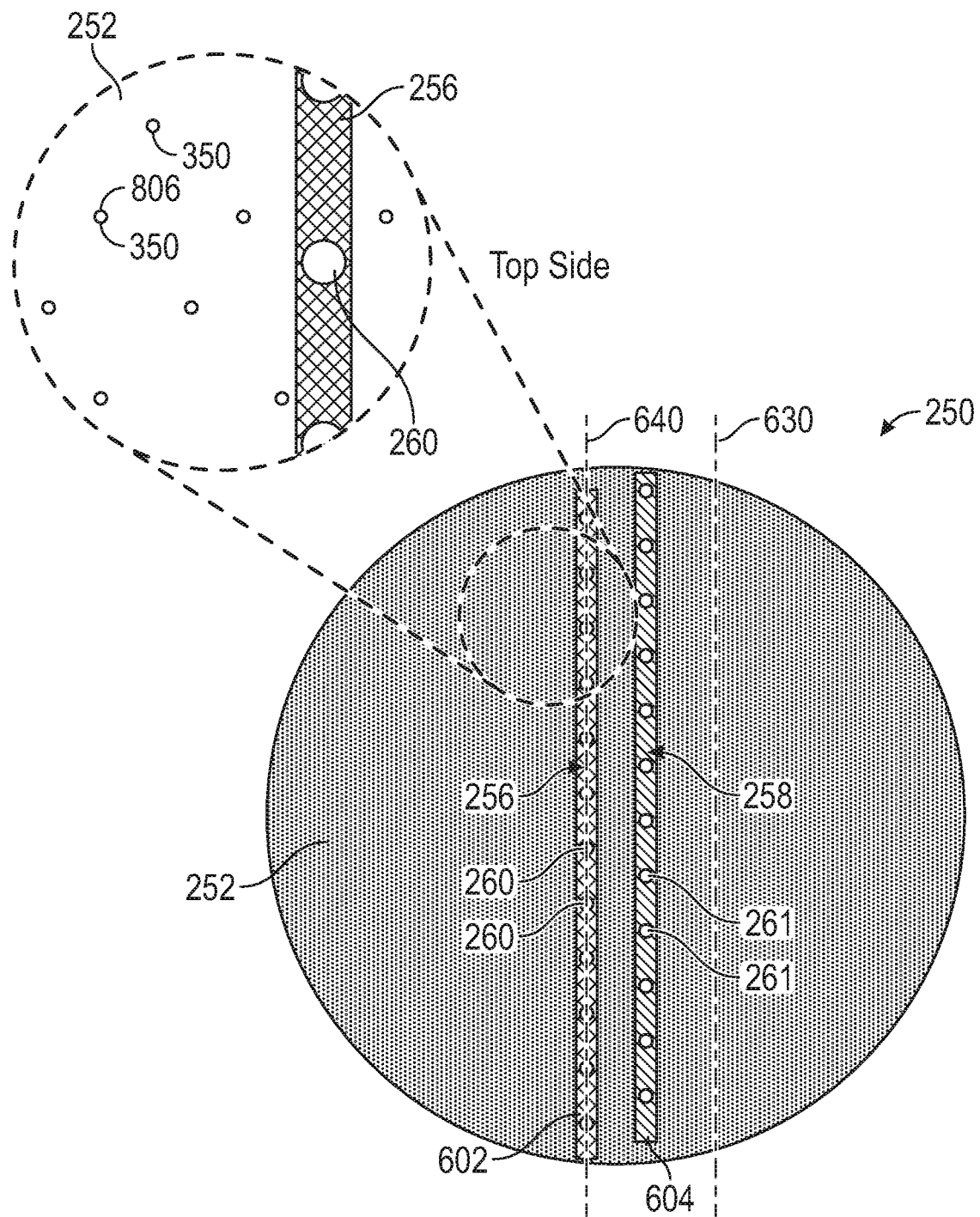
FIG. 8A illustrates a top plan view of a middle plate of the gas distributor apparatus according to a fourth embodiment.

FIG. 8A illustrates a top plan view of a middle plate 250 of the gas distributor apparatus 150 according to a fourth embodiment. The top plan view illustrates the top surface 252 of the middle plate 250. The top surface 252 of the middle plate 250 is a circular surface and includes the first upper channel 256, the second upper channel 258, the first connection passages 260, and the second connection passages 261.

The first upper channel 256 is a first chord portion 602. The first chord portion 602 is a linear portion, which is slightly offset from the center of the top surface 252 of the middle plate 250. The first chord portion 602 extends over more than half of the diameter of the top surface 252, such that the first chord portion 602 has a length of about 70% to about 80% of the diameter of the top surface 252. The first upper channel 256 includes the first connection passages 260 disposed therein.

The second upper channel 258 is a second chord portion 604. The second chord portion 604 is a linear portion, which is slightly offset from the center of the top surface 252 of the middle plate 250. The second chord portion 604 extends over more than half of the diameter of the top surface 252, such that the second chord portion 604 has a length of about 70% to about 80% of the diameter of the top surface 252. The second upper channel 258 includes the second connection passages 261 disposed therein. The second chord portion 604 is parallel to the first chord portion 602.

The first plane 630 is the plane through the middle plate 250, which intersects the smallest amount of either of the first upper channel 256 or the second upper channel 258. The second plane 640 is the plane through the middle plate 250, which intersects the length of a portion of the first upper channel 256, such that the second plane 640 passes through the length of the first chord portion 602.

The middle plate 250 includes a plurality of main passages 350 formed through the middle plate 250. The main passages 350 extend through the middle plate 250 and are disposed around, but do not intersect the first upper channel 256 or the second upper channel 258.

Figure 8B:
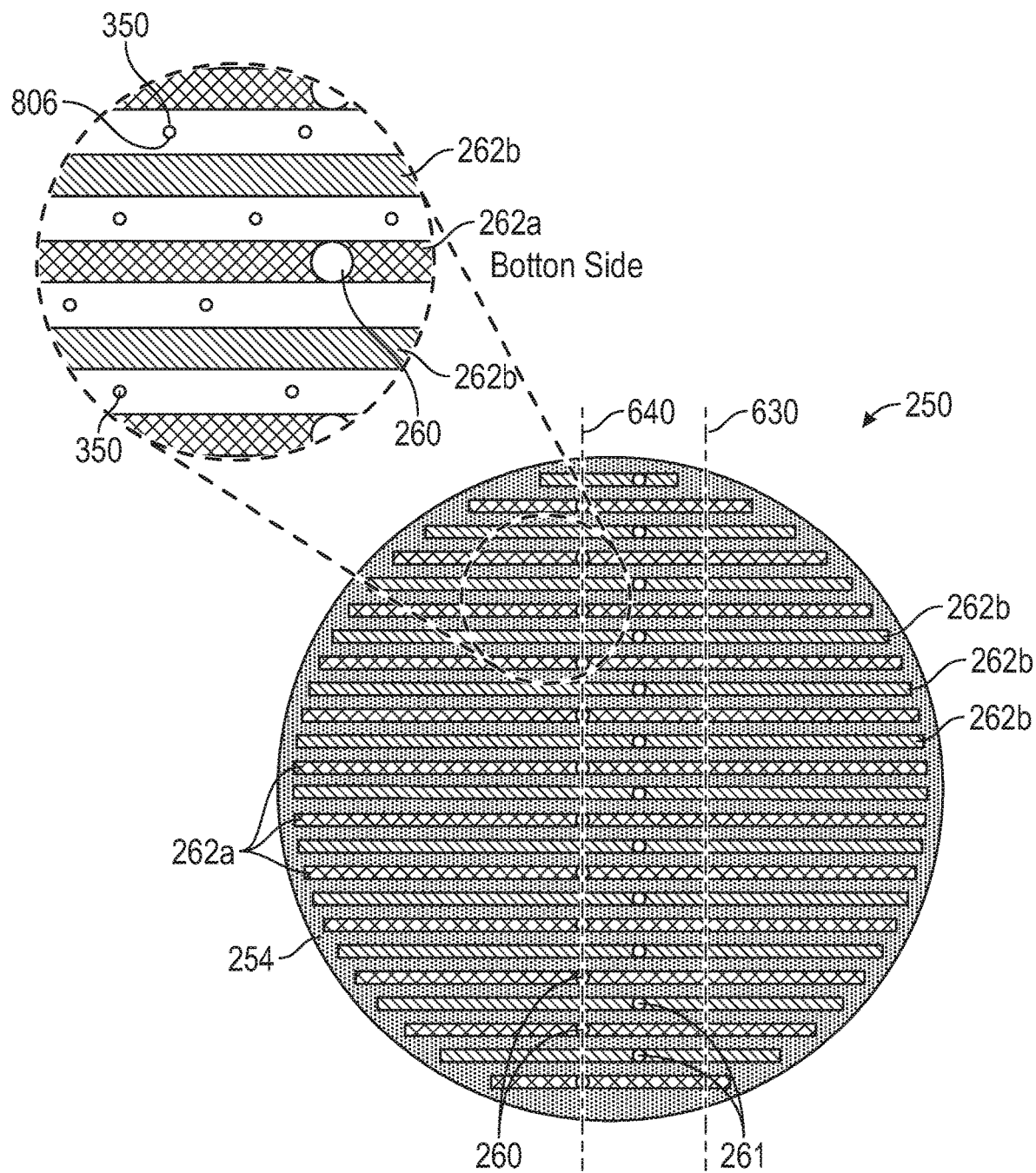
FIG. 8B illustrates a bottom plan view of a middle plate of the gas distributor apparatus according to a fourth embodiment.

FIG. 8B illustrates a bottom plan view of a middle plate 250 of the gas distributor apparatus 150 according to a fourth embodiment. The fourth embodiment illustrates the bottom surface 254 of the middle plate 250. The bottom surface 254 of the middle plate 250 includes a plurality of first lower channels 262a and a plurality of second lower channels 262b formed therein.

The first lower channels 262a are partial chords across the bottom surface 254 of the middle plate 250. The first lower channels 262a are disposed perpendicularly to the first upper channel 256. The first lower channels 262a extend from the bottom of each of the first connection passages 260 across the bottom surface 254 in either direction, such that the first lower channels 262a span a majority of the width of the bottom surface 254, such as about 70% to about 95% of the width of the bottom surface 254 at the respective locations of each of the first lower channels 262a. Each of the first lower channels 262a of FIG. 8B are parallel to one another.

The second lower channels 262b are partial chords across the bottom surface 254 of the middle plate 250. The second lower channels 262b are disposed perpendicularly to the second upper channel 258. The second lower channels 262b extend from the bottom of each of the second connection passages 261 across the bottom surface 254 in either direction, such that the second lower channels 262b span a majority of the width of the bottom surface 254, such as about 70% to about 95% of the width of the bottom surface 254 at the respective locations of each of the second lower channels 262b. Each of the second lower channels 262b of FIG. 8B are parallel to one another in a first direction, wherein the first direction is parallel to the bottom surface 254 of the middle plate 250. Each of the second lower channels 262b are also parallel to each of the first lower channels 262a of FIG. 8B.

The first lower channels 262a and the second lower channels 262b are formed in an interleaved and alternating pattern, such that a first lower channel 262a is formed between each adjacent pair of second lower channels 262b and a second lower channel 262b is formed between each adjacent pair of first lower channels 262a.

The middle plate 250 includes a plurality of main passages 350 formed through the middle plate 250. The main passages 350 extend through the middle plate 250 and are disposed around, but do not intersect the first lower channel 262a or the second lower channel 262b. The main passages 350 are formed between each of the first lower channel 262a and the second lower channel 262b.

Top Plate and Lower Plate Configuration Examples

Figure 9:
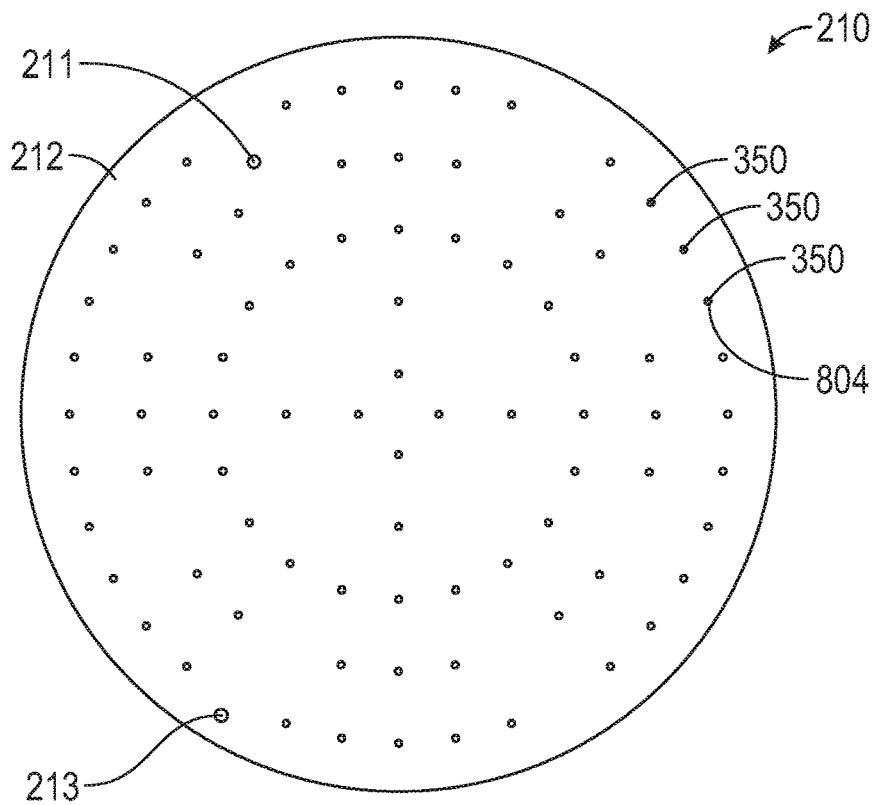
FIG. 9 illustrates a plan view of an upper plate after a third manufacturing operation.

FIG. 9 illustrates a plan view of an upper plate 210 after a third manufacturing operation 1106. The top surface 212 of the upper plate 210 is shown in FIG. 9. The upper plate 210 includes the top section 804 of the main passages 350. The main passages 350 are distributed across the top surface 212 of the upper plate 210 and are distributed between the first upper channel 256, the second upper channel 258, the first connection passages 260, the second connection passages 261, the first lower channels 262a, the second lower channels 262b, the first passages 226a, and the second passages 226b.

Figure 10:
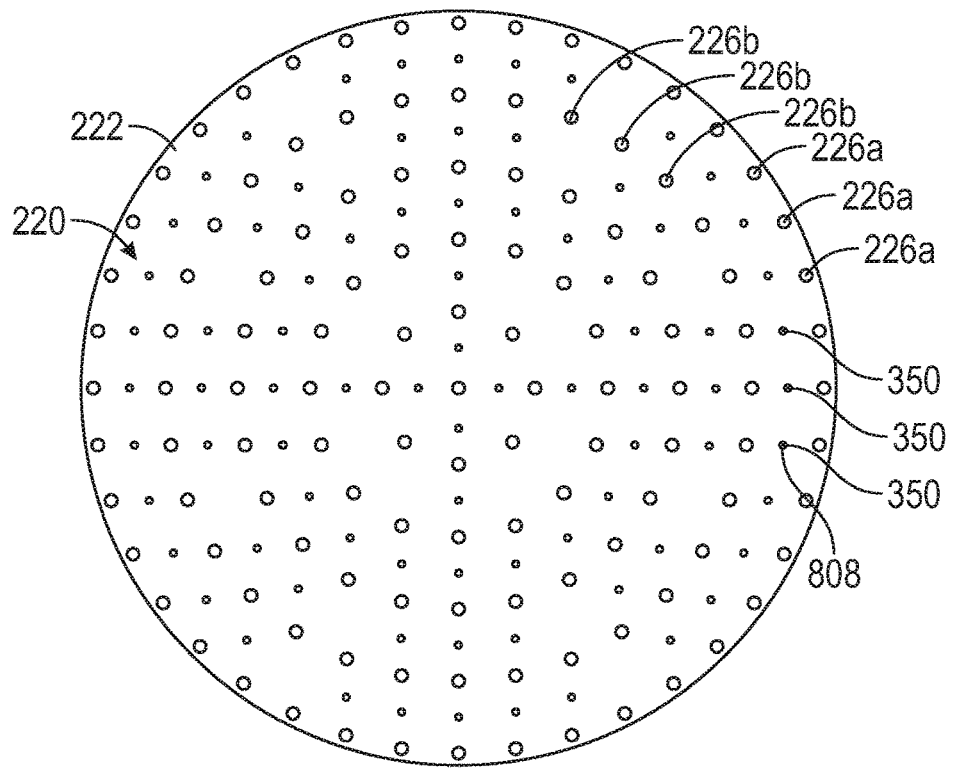
FIG. 10 illustrates a plan view of a lower plate after a third manufacturing operation.

FIG. 10 illustrates a plan view of a lower plate 220 after a third manufacturing operation 1106. The top surface 222 of the lower plate 220 is shown in FIG. 10. The lower plate 220 includes the bottom section 808 of the main passages 350, the plurality of first passages 226a, and the plurality of second passages 226b. The main passages 350 are disposed between the first passages 226a and the second passages 226b. In embodiments similar to those in FIG. 10, the main passages 350, the first passages 226a, and the second passages 226b are disposed in concentric and alternating rings. The lower plate 220 of FIG. 10 is a schematic drawing of an embodiment of a suitable lower plate 220 for use with the middle plate 250 of FIG. 5A-5B.

The apparatus and method described herein allow for a greater complexity of gas distribution channels through the gas distribution apparatus so that the gas distribution apparatus can be used to uniformly and/or individually deliver three or more gases. By utilizing channels on both the top surface and the bottom surface of the middle plate, additional distribution features are formed without the need for additional manufacturing and bonding operations. The bonding of the plates after forming the channels and passages additionally allows for any burs or scrap material within the formations to be removed with simple cleaning operations before the bonding operation takes place. The method of manufacturing the gas distribution apparatus reduce manufacturing time and cost by utilizing only one bonding operation.

Some alternative embodiments of the present disclosure include the formation of the first upper channel 256 and the second upper channel 258 in the bottom surface 214 of the upper plate 210. Additionally, some embodiments may include additional upper channels, lower channels, and connection passages to allow for additional process gases to be flown through the gas distribution apparatus.

While the foregoing is directed to embodiments of the present disclosure, other and further embodiments of the disclosure may be devised without departing from the basic scope thereof, and the scope thereof is determined by the claims that follow.

What is claimed is:

1. A method of manufacturing a gas distribution apparatus comprising:
   forming a lower plate having a top surface and a bottom surface that is opposite to the top surface, by a process comprising:
      forming a plurality of first passages extending through the lower plate from the top surface to the bottom surface; and
      forming a plurality of second passages extending through the lower plate from the top surface to the bottom surface;
   forming a middle plate having a top surface and a bottom surface that is opposite to the top surface, by a process comprising:
      forming one or more first lower channels on the bottom surface of the middle plate, each of the one or more first lower channels forming a concentric ring on the bottom surface of the middle plate;
      forming one or more second lower channels on the bottom surface of the middle plate, each of the one or more second lower channels forming a concentric ring on the bottom surface of the middle plate;
      forming a first upper channel on the top surface of the middle plate, the first upper channel forming two arcs on the top surface of the middle plate;
      forming a second upper channel on the top surface of the middle plate, the second upper channel forming two cross strokes that are perpendicular to each other across the top surface of the middle plate;
      forming a plurality of first connection passages between the first lower channels and the first upper channel to fluidly connect the first lower channels and the first upper channel; and
      forming a plurality of second connection passages between the second lower channels and the second upper channel to fluidly connect the second lower channels and the second upper channel;
   forming an upper plate having a top surface and a bottom surface that is opposite to the top surface, by a process comprising:
      forming a first gas input and a second gas input along an outer portion of the upper plate through the upper plate from the top surface to the bottom surface;
   bonding, by one of a brazing bonding process or a diffusion bonding process, the top surface of the lower plate to the bottom surface of the middle plate and the top surface of the middle plate to the bottom surface of the upper plate, wherein the first gas input is aligned with the first upper channel and the second gas input is aligned with the second upper channel; and
   subsequent to the bonding of the lower plate, the middle plate, and the upper plate, drilling a plurality of main passages extending through the lower plate, the middle plate, and the upper plate from a top surface of the upper plate to the bottom surface of the lower plate.

2. The method of claim 1, wherein the main passages are offset from the first passages, the second passages, the first lower channels, the second lower channels, the first upper channel, the second upper channel, the first connection passages, and the second connection passages.

3. The method of claim 1, wherein:
   the bonding of the lower plate, the middle plate, and the upper plate comprises aligning one of the one or more first lower channels of the middle plate to a first plurality of the first passages of the lower plate,
   the first plurality of the first passages are in fluid communication with the one of the one or more first lower channels,
   the brazing bonding process comprises flowing a filler metal into space between surfaces to be bonded, and
   the diffusion bonding process comprises contacting the surfaces to be bonded with one another.

4. The method of claim 1, wherein the first lower channels and the second lower channels are parallel to each other in a first direction, wherein the first direction is parallel to the bottom surface.

5. The method of claim 1, wherein the first passages are aligned with one of the one or more first lower channels and the second passages are aligned with one of the one or more the second lower channels.

6. The method of claim 5, wherein
   the first passages, the first lower channels, the first upper channel, and the first connection passages form a continuous first gas path, and
   the second passages, the second lower channels, the second upper channel, and the second connection passages form a continuous second gas path.

7. The method of claim 1, wherein a main passage opening defined by a surface of the main passages comprise a linear cylindrical shape as the main passage opening of the main passages extends from the top surface of the upper plate to the bottom surface of the lower plate.

8. A method of manufacturing a gas distribution apparatus comprising:
   drilling through a lower plate, a middle plate, and an upper plate, in which a top surface of the lower plate is bonded to a bottom surface of the middle plate, and a top surface of the middle plate is bonded to a bottom surface of an upper plate, by one of a brazing bonding process or a diffusion bonding process,
   wherein the lower plate comprises:
      a plurality of first passages extending through a body portion of the lower plate; and
      a plurality of second passages extending through the body portion of the lower plate,
   wherein the middle plate comprises:

one or more first lower channels that are formed on the bottom surface of the middle plate, each of the one or more first lower channels forming a concentric ring on the bottom surface of the middle plate;

one or more second lower channels that are formed on the bottom surface of the middle plate, each of the one or more second lower channels forming a concentric ring on the bottom surface of the middle plate;

a first upper channel on the top surface of the middle plate, the first upper channel forming two arcs on the top surface of the middle plate;

a second upper channel on the top surface of the middle plate, the second upper channel forming two cross strokes that are perpendicular to each other across the top surface of the middle plate;

a plurality of first connection passages between the first lower channels and the first upper channel to fluidly connect the first lower channels and the first upper channel; and a plurality of second connection passages between the second lower channels and the second upper channel to fluidly connect the second lower channels and the second upper channel, and wherein the upper plate comprises a first gas input and a second gas input along an outer portion of the upper plate through the upper plate from the top surface to the bottom surface.

9. The method of claim 8, wherein the first lower channels and the second lower channels are parallel to each other in a first direction, wherein the first direction is parallel to the bottom surface.

10. The method of claim 8, wherein the first passages are aligned with one of the one or more first lower channels and the second passages are aligned with one of the one or more second lower channels.

11. The method of claim 10 wherein
the first passages, the first lower channels, the first upper channel, and the first connection passages form a continuous first gas path, and
the second passages, the second lower channels, the second upper channel, and the second connection passages form a continuous second gas path.

12. The method of claim 8, wherein a main passage opening defined by a surface of the main passages comprise a linear cylindrical shape as the main passage opening of the main passages extend through the upper plate, the middle plate and the lower plate.

* * * * *